(12) United States Patent
Wang et al.

(10) Patent No.: US 10,049,938 B2
(45) Date of Patent: Aug. 14, 2018

(54) SEMICONDUCTOR DEVICES, FINFET DEVICES, AND MANUFACTURING METHODS THEREOF

(71) Applicant: Taiwan Semiconductor Manufacturing Company, Ltd., Hsin-Chu (TW)

(72) Inventors: Sung-Li Wang, Zhubei (TW); Chih-Sheng Chang, Hsin-Chu (TW); Sey-Ping Sun, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 14/599,246

(22) Filed: Jan. 16, 2015

(65) Prior Publication Data

US 2016/0211338 A1 Jul. 21, 2016

(51) Int. Cl.
*H01L 29/06* (2006.01)
*H01L 29/78* (2006.01)
(Continued)

(52) U.S. Cl.
CPC ........ *H01L 21/823431* (2013.01); *H01L 21/823418* (2013.01); *H01L 21/823468* (2013.01); *H01L 21/823475* (2013.01); *H01L 21/823481* (2013.01); *H01L 21/823814* (2013.01); *H01L 27/0886* (2013.01); *H01L 29/0649* (2013.01);
(Continued)

(58) Field of Classification Search
CPC ........ H01L 27/0886; H01L 21/823431; H01L 21/823821; H01L 21/845; H01L 27/0924; H01L 27/1211; H01L 29/41791; H01L 29/66795; H01L 29/785; H01L 29/7851; H01L 29/7853; H01L 29/6653; H01L 29/66553; H01L 29/6656; H01L 29/66545; H01L 2924/13067; H01L 29/0657; H01L 29/7842; H01L 29/7848; H01L 21/823814; H01L 21/823418; H01L 21/823475; H01L 21/823468; H01L 21/823481;
(Continued)

(56) References Cited

U.S. PATENT DOCUMENTS 5,552,346 A * 9/1996 Huang ............ H01L 21/31053
257/E21.244
7,183,152 B1 * 2/2007 Dakshina-Murthy ... H01L 21/84
257/E21.703

(Continued)

OTHER PUBLICATIONS

Oxford Dictionaries, "substantially", Oxford Dictionaries, Apr. 2010, Oxiford Dictionaries, definition/american_english.*

(Continued)

*Primary Examiner* — Yu Chen
*Assistant Examiner* — Pauline Vu
(74) *Attorney, Agent, or Firm* — Slater Matsil, LLP

(57) ABSTRACT

Semiconductor devices, fin field effect transistor (FinFET) devices, and methods of manufacturing semiconductor devices are disclosed. In some embodiments, a semiconductor device includes a substrate comprising a first fin and a second fin. A first epitaxial fin is disposed over the first fin, and a second epitaxial fin is disposed over the second fin. The second fin is proximate the first fin. The first epitaxial fin and the second epitaxial fin have an upper portion with a substantially pillar shape.

20 Claims, 33 Drawing Sheets

(51) Int. Cl.
| | |
|---|---|
| H01L 21/8234 | (2006.01) |
| H01L 29/66 | (2006.01) |
| H01L 21/8238 | (2006.01) |
| H01L 29/165 | (2006.01) |
| H01L 29/161 | (2006.01) |
| H01L 29/16 | (2006.01) |
| H01L 29/417 | (2006.01) |
| H01L 27/088 | (2006.01) |
| H01L 29/51 | (2006.01) |
| H01L 29/423 | (2006.01) |

(52) U.S. Cl.
CPC ........ *H01L 29/0653* (2013.01); *H01L 29/161* (2013.01); *H01L 29/165* (2013.01); *H01L 29/1608* (2013.01); *H01L 29/41783* (2013.01); *H01L 29/41791* (2013.01); *H01L 29/518* (2013.01); *H01L 29/665* (2013.01); *H01L 29/6653* (2013.01); *H01L 29/6656* (2013.01); *H01L 29/66545* (2013.01); *H01L 29/66636* (2013.01); *H01L 29/66795* (2013.01); *H01L 29/785* (2013.01); *H01L 29/7842* (2013.01); *H01L 29/7848* (2013.01); *H01L 29/7851* (2013.01); *H01L 29/7853* (2013.01); *H01L 29/42364* (2013.01); *H01L 2029/7858* (2013.01)

(58) Field of Classification Search
CPC . H01L 29/161; H01L 29/165; H01L 29/1608; H01L 29/665
See application file for complete search history.

(56) References Cited

U.S. PATENT DOCUMENTS

| | | | |
|---|---|---|---|
| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 2004/0036126 | A1* | 2/2004 | Chau ............ B82Y 10/00 257/401 |
| 2004/0217420 | A1* | 11/2004 | Yeo ............ H01L 21/84 257/347 |
| 2005/0285186 | A1* | 12/2005 | Fujiwara ............ H01L 29/785 257/327 |
| 2009/0095980 | A1* | 4/2009 | Yu ............ H01L 29/66795 257/190 |
| 2009/0280641 | A1 | 11/2009 | Kang et al. |
| 2011/0147840 | A1* | 6/2011 | Cea ............ H01L 29/41791 257/347 |
| 2011/0193175 | A1* | 8/2011 | Huang ............ H01L 21/823431 257/386 |
| 2011/0210404 | A1* | 9/2011 | Su ............ H01L 29/785 257/401 |
| 2012/0211807 | A1* | 8/2012 | Yu ............ H01L 29/41791 257/288 |
| 2012/0280250 | A1* | 11/2012 | Basker ............ H01L 21/823821 257/77 |
| 2012/0319211 | A1* | 12/2012 | van Dal ............ H01L 29/66795 257/401 |
| 2013/0049068 | A1* | 2/2013 | Lin ............ H01L 29/7853 257/192 |
| 2013/0099282 | A1* | 4/2013 | Chen ............ H01L 29/66795 257/190 |
| 2013/0161756 | A1* | 6/2013 | Glass ............ H01L 29/66545 257/369 |
| 2013/0175659 | A1* | 7/2013 | Liu ............ H01L 29/66795 257/506 |
| 2013/0200455 | A1* | 8/2013 | Lo ............ H01L 29/66795 257/347 |
| 2013/0228875 | A1* | 9/2013 | Lee ............ H01L 29/66795 257/401 |
| 2013/0234147 | A1* | 9/2013 | Wu ............ H01L 29/66795 257/76 |
| 2013/0249003 | A1* | 9/2013 | Oh ............ H01L 21/845 257/347 |
| 2013/0334606 | A1* | 12/2013 | Shen ............ H01L 29/66818 257/368 |
| 2014/0001574 | A1 | 1/2014 | Chen et al. |
| 2014/0065782 | A1* | 3/2014 | Lu ............ H01L 29/785 438/294 |
| 2014/0110755 | A1 | 4/2014 | Colinge |
| 2014/0151812 | A1 | 6/2014 | Liaw |
| 2014/0197456 | A1* | 7/2014 | Wang ............ H01L 29/785 257/192 |
| 2014/0197457 | A1* | 7/2014 | Wang ............ H01L 29/785 257/192 |
| 2014/0203370 | A1* | 7/2014 | Maeda ............ H01L 29/785 257/365 |
| 2014/0217517 | A1 | 8/2014 | Cai et al. |
| 2014/0248761 | A1* | 9/2014 | Park ............ H01L 21/823871 438/586 |
| 2014/0273397 | A1* | 9/2014 | Rodder ............ H01L 21/76 438/400 |
| 2014/0273429 | A1* | 9/2014 | Wei ............ H01L 29/401 438/595 |
| 2014/0299934 | A1* | 10/2014 | Kim ............ H01L 29/7848 257/347 |
| 2014/0374827 | A1* | 12/2014 | Suh ............ H01L 29/785 257/347 |
| 2014/0377922 | A1* | 12/2014 | Fung ............ H01L 29/66795 438/283 |
| 2015/0035046 | A1* | 2/2015 | Kim ............ H01L 29/42392 257/327 |
| 2015/0091086 | A1* | 4/2015 | Lu ............ H01L 29/7833 257/336 |
| 2015/0108544 | A1* | 4/2015 | Ching ............ H01L 21/823821 257/192 |
| 2015/0187571 | A1* | 7/2015 | Fan ............ H01L 29/0653 257/401 |
| 2015/0187943 | A1* | 7/2015 | Lee ............ H01L 29/66636 257/192 |
| 2015/0200271 | A1* | 7/2015 | Lee ............ H01L 29/785 257/401 |
| 2015/0214051 | A1* | 7/2015 | Kim ............ H01L 21/02636 257/192 |
| 2015/0255576 | A1* | 9/2015 | Liao ............ H01L 21/0262 257/288 |
| 2015/0295087 | A1* | 10/2015 | Cheng ............ H01L 29/7851 257/192 |
| 2015/0303118 | A1* | 10/2015 | Wang ............ H01L 21/823481 257/401 |

OTHER PUBLICATIONS

Zaima, et al., "Study of Reaction and Electrical Properties at Ti/SiGe/Si(100) Contacts for Ultralarge Scale Integrated Applications," Journal of Vacuum Science & Technology B, vol. 16, No. 5, Sep./Oct. 1998, pp. 2623-2628.

* cited by examiner

SEMICONDUCTOR DEVICES, FINFET DEVICES, AND MANUFACTURING METHODS THEREOF

CROSS-REFERENCE TO RELATED APPLICATIONS

This application relates to the following co-pending and commonly assigned patent application: Ser. No. 14/257,809, filed on Apr. 21, 2014 and entitled, "Wrap-Around Contact," which application is hereby incorporated herein by reference.

BACKGROUND

Semiconductor devices are used in a variety of electronic applications, such as computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

A transistor is an element that is utilized extensively in semiconductor devices. There may be thousands of transistors on a single integrated circuit (IC) in some applications, for example. One common type of transistor used in semiconductor device fabrication is a metal oxide semiconductor field effect transistor (MOSFET).

Multiple gate field-effect transistors (MuGFETs) are a recent development in semiconductor technology which typically are MOSFETs that incorporate more than one gate into a single device. The multiple gates may be controlled by a single gate electrode, where the multiple gate surfaces act electrically as a single gate. The multiple gates may also be controlled by independent gate electrodes. One type of MuGFET is referred to as a fin field effect transistor (FinFET) device, which is a transistor structure with a fin-like semiconductor channel that is raised vertically out of the silicon surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
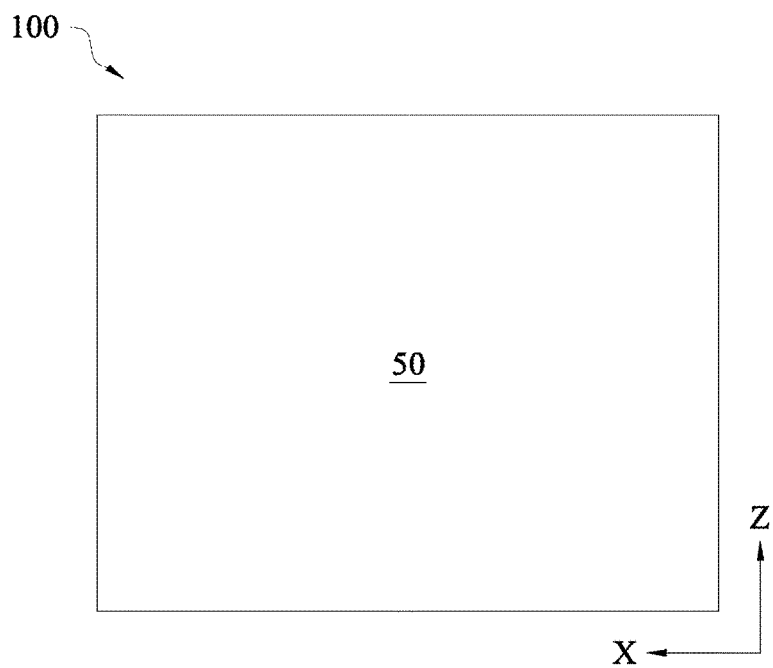
FIGS. 1 through 9, 10A, 10B, 11A, 11B, 12A, 12B, 13A, 13B, 14A, 14B, 15A, 15B, 16B, 17B, 18A, 18B, 19A, and 19B are cross-sectional views that illustrate a semiconductor device at various stages of a manufacturing process in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure comprise semiconductor devices wherein source and drain regions are epitaxially grown that have a substantially pillar shape. Source and drain (SD) regions of FinFET devices include epitaxial fins that have pillar shapes rather than rhombus or diamond shapes (e.g., in a cross-sectional view) are disclosed. A sacrificial material is used to form and control the pillar shape formation during epitaxial growth, which will be described further herein. The pillar-shaped epitaxial fins allow the formation of contacts that fully wrap around the epitaxial fins of the SD regions.

Some embodiments described herein are in reference to a specific context, namely forming fin field effect transistor (FinFET) devices. Aspects of this disclosure may also be applied in other contexts, such as forming contacts for any type of device or semiconductor device. Specific dimensions given below are for illustrative purposes for a given technology node, such as for 15 nm technology or smaller. Other embodiments contemplate different dimensions, particularly at different technology nodes. The figures discussed below are not necessarily drawn to scale.

FIGS. 1 through 9, 10A, 10B, 11A, 11B, 12A, 12B, 13A, 13B, 14A, 14B, 15A, 15B, 16B, 17B, 18A, 18B, 19A, and 19B are cross-sectional views that illustrate a semiconductor device 100 comprising a FinFET device at various stages of a manufacturing process in accordance with some embodiments of the present disclosure. FIGS. 1 through 9 are cross-sectional views along an X-Z plane, e.g., along a Y axis of a substrate 50.

Referring first to FIG. 1, to manufacture a semiconductor device 100 in accordance with some embodiments, a substrate 50 is provided. The substrate 50 may be part of a wafer. The substrate 50 may comprise a semiconductor substrate, such as a silicon substrate, a silicon carbon substrate, a silicon germanium substrate, or a substrate formed of other semiconductor materials, as examples. The substrate 50 may comprise a bulk substrate, a semiconductor-on-insulator (SOI) substrate, or other acceptable types of substrates. The substrate 50 may be lightly doped with a p-type or an n-type impurity. In some of the embodiments shown in FIG. 1, the substrate 50 comprises a silicon wafer.

Figure 2:
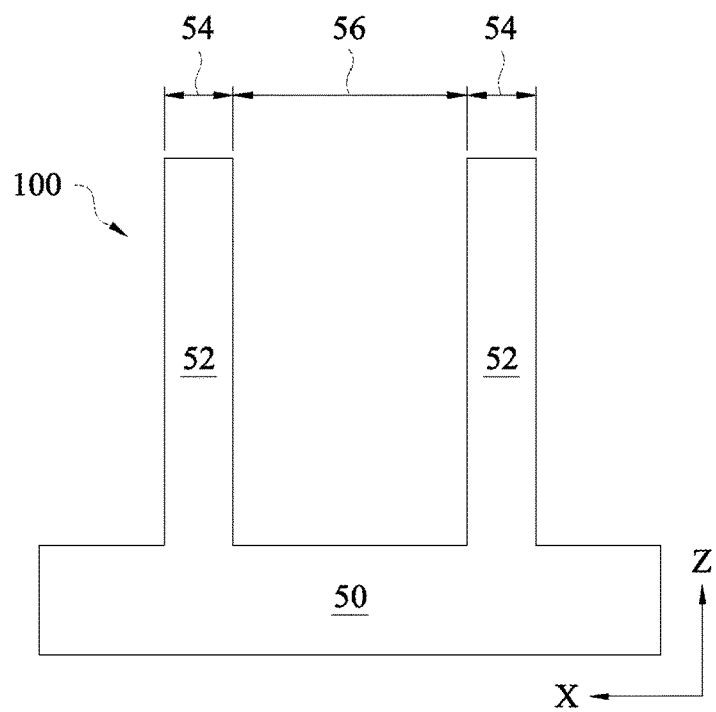
Figure 3:
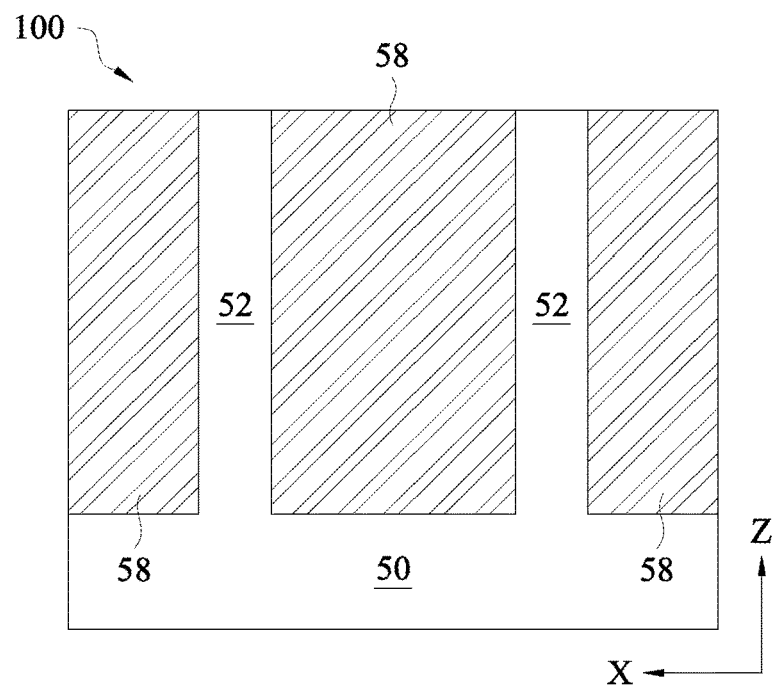

FIGS. 2 and 3 illustrate the formation of fins 52 and isolation regions 58 between neighboring fins 52. In FIG. 2, a plurality of the fins 52 are formed in the substrate 50. In some embodiments, the fins 52 may be formed in the substrate 50 by etching trenches in the substrate 50. The etching process used to form the fins 52 may comprise any acceptable etch process, such as a reactive ion etch (RIE), neutral beam etch (NBE), photolithography, the like, or a combination thereof. The etch process may be anisotropic, for example. The fins 52 may have a width 54. Neighboring fins 52 may be a distance 56 apart. A pitch between neighboring fins 52 may be the distance 56 plus the width 54. In some embodiments, the width 54 of the fins 52 is between about 4 nm and about 16 nm, such as about 13 nm, and the distance 56 between neighboring fins 52 is between about 10 nm and about 44 nm, such as about 35 nm, as examples. The fins 52 may also comprise other dimensions and relative dimensions.

In FIG. 3, an insulation material is formed between neighboring fins 52 to form isolation regions 58. The insulation material of the isolation regions 58 may comprise an oxide, such as silicon oxide, a nitride, the like, or a combination thereof, and the insulating material may be formed using a high density plasma chemical vapor deposition (HDP-CVD) or a flowable CVD (FCVD) (e.g., a CVD-based material deposition in a remote plasma system and post curing process to convert it to another material, such as an oxide), the like, or a combination thereof, as examples. Other insulation materials formed by any acceptable process may be used to form the isolation regions 58. In some embodiments, the insulation material of the isolation regions 58 comprises silicon oxide formed by a FCVD process. A planarization process, such as a chemical mechanical polish (CMP) process, may be used to remove any excess insulation material from top surfaces of the fins 52 and form top surfaces of the isolation regions 58 and top surfaces of the fins 52 that are co-planar. The isolation regions 58 may comprise Shallow Trench Isolation (STI) regions in some embodiments, for example.

Figure 4:
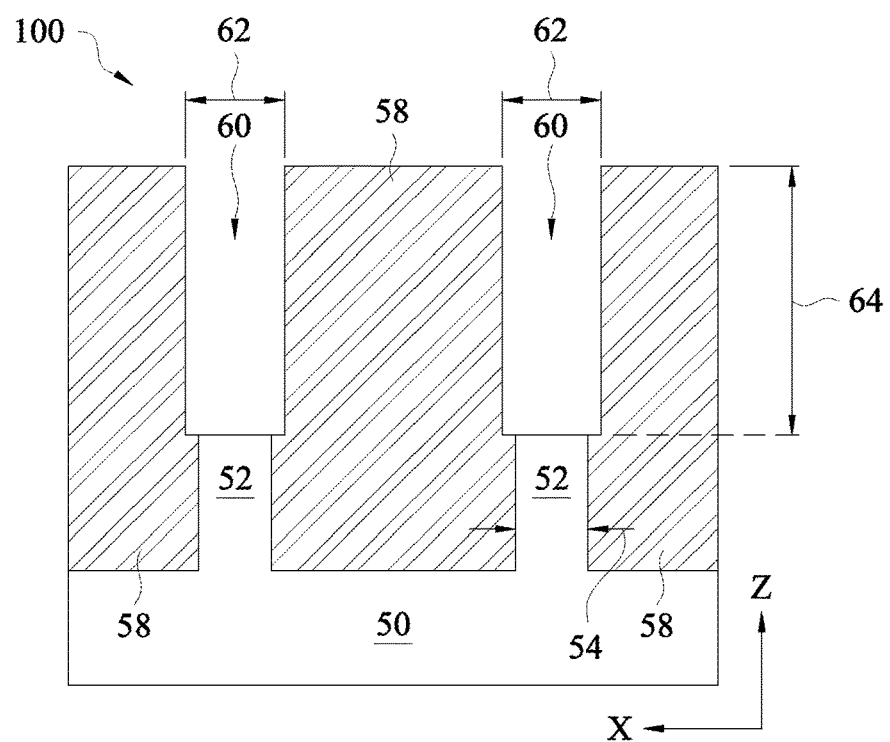

In FIG. 4, recesses 60 are formed in the fins 52 and/or the isolation regions 58. The recesses 60 may be formed by etching using any acceptable etch process, such as a RIE, NBE, tetramethyalammonium hydroxide (TMAH), ammonium hydroxide (NH$_4$OH), a wet etchant capable of etching silicon with good etch selectivity between silicon and a material of the isolation regions 58, the like, or a combination thereof. The etch process may be anisotropic, for example. The etch process to form the recesses 60 may also comprise other types of etch processes and properties.

After the etch process, surfaces of the fins 52 are exposed as at least portions of the bottom surfaces of the recesses 60. As illustrated, the bottom surfaces of the recesses 60 include all of top surfaces of the fins 52 after an etching process. In other embodiments, some misalignment may occur such that a sidewall of the recess 60 includes a portion of a fin 52 and/or other configurations, not shown.

The bottom surfaces of the recesses 60 also include surfaces of the isolation regions 58 in some embodiments wherein the widths 62 of the recesses 60 are greater than the widths 54 of the fins 52. The recesses 60 have depths 64. As illustrated, the depths 64 are such that a lower portion of the fins 52 remain after the etching process. The recesses 60 may have depths 64 such that the fins 52 are wholly removed and/or the recesses 60 extend into the substrate 50 in some embodiments, not shown. In some embodiments, the widths 62 are between about 4.7 nm and about 16.3 nm, such as about 15.5 nm, and the depths 64 are between about 38.5 nm and about 40.5 nm, such as about 39.5 nm, as examples. The widths 62 and depths 64 may also comprise other dimensions.

Figure 5:
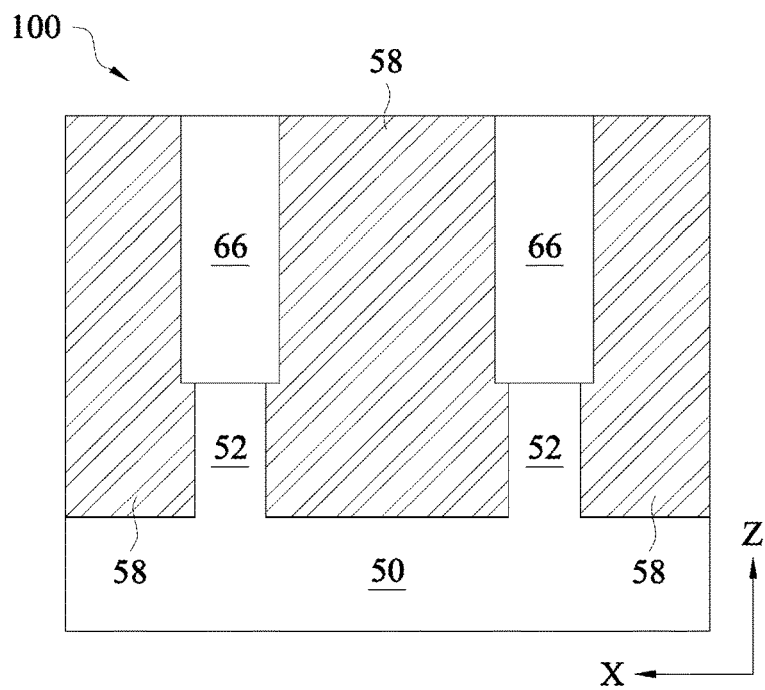

In FIG. 5, epitaxial fins 66 are formed in the recesses 60. In some embodiments, the epitaxial fins 66 are formed by epitaxially growing a material in the recesses 60 over each of the fins 52 to form a plurality of epitaxial fins 66. An epitaxial fin 66 is formed over each of the fins 52 in some embodiments, for example. The epitaxial fins 66 are also referred to herein, e.g., in some of the claims, as first epitaxial fins 66 or a plurality of first epitaxial fins 66.

The epitaxial fins 66 may be formed using metal-organic CVD (MOCVD), molecular beam epitaxy (MBE), liquid phase epitaxy (LPE), vapor phase epitaxy (VPE), selective epitaxial growth (SEG), the like, or a combination thereof. In some embodiments, the epitaxial fins 66 comprise silicon germanium, where the concentration of germanium is about 45% (e.g., $Si_{1-x}Ge_x$, wherein x=0.45). In other embodiments, the concentration of germanium (e.g., the value of x) may be any amount from about 0% to about 100%, and in still other embodiments, the epitaxial fins 66 may comprise other types of materials, such as silicon, silicon carbide, germanium, a III-V compound semiconductor, a II-VI compound semiconductor, or the like. For example, in some embodiments, the available materials for forming a III-V compound semiconductor include, but are not limited to, InAs, AlAs, GaAs, InP, GaN, InGaAs, InAlAs, GaSb, AlSb, AlP, GaP, and the like. A planarization process, such as a CMP process, may be used to form the top surfaces of the epitaxial fins 66 and the isolation regions 58 to be co-planar.

Figure 6:
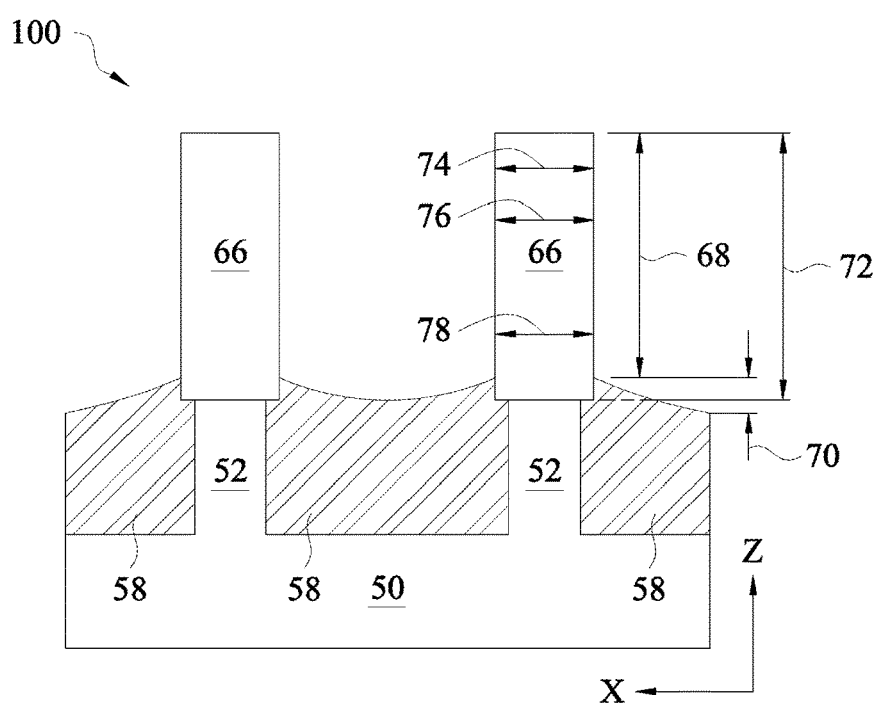

The isolation regions 58 are then recessed, as shown in FIG. 6. The isolation regions 58 are recessed such that the epitaxial fins 66 protrude from between neighboring isolation regions 58. The isolation regions 58 may be recessed using an acceptable etching process, such as one that is selective to the material of the isolation regions 58. For example, a chemical oxide removal using a CERTAS® etch, an Applied Materials SICONI tool, dilute hydrofluoric (dHF) acid, or other chemistries, tools, and methods may be used. In some embodiments, the epitaxial fins 66 may have some loss due to the recessing of the isolation regions 58. For example, in some embodiments, an epitaxial fin 66 height (e.g., in the Z-direction) loss may be about 0.5 nm, and an epitaxial fin 66 width (e.g., in the X-direction) loss may be about 1 nm. In some embodiments, the fin height 68, e.g., the portion of the epitaxial fin 66 and/or fin 52 protruding from neighboring isolation regions 58, is between about 32 nm to about 34 nm, such as about 33 nm, and the epitaxial fin height 72 is between about 38 nm to about 40 nm, such as about 39 nm, as examples. A difference between the epitaxial fin height 72 and the fin height 68 in some embodiments is between about 4 nm and about 8 nm, such as about 6 nm, for example. Furthermore, as a result of the recessing process, the isolation regions 58 may have dishing, and in some embodiments, a dishing depth 70 is less than 5 nm, such as about 4 nm, for example. In some embodiments, a width 74 at a depth of about 5 nm, a width 76 at a depth of about 15 nm, and a width 78 at a depth of about 30 nm from the top of the epitaxial fin 66 are each between about 13.8 nm and about 15.2 nm, such as about 14.5 nm, as examples. The fins 66 may also comprise other dimensions and relative dimensions.

Figure 7:
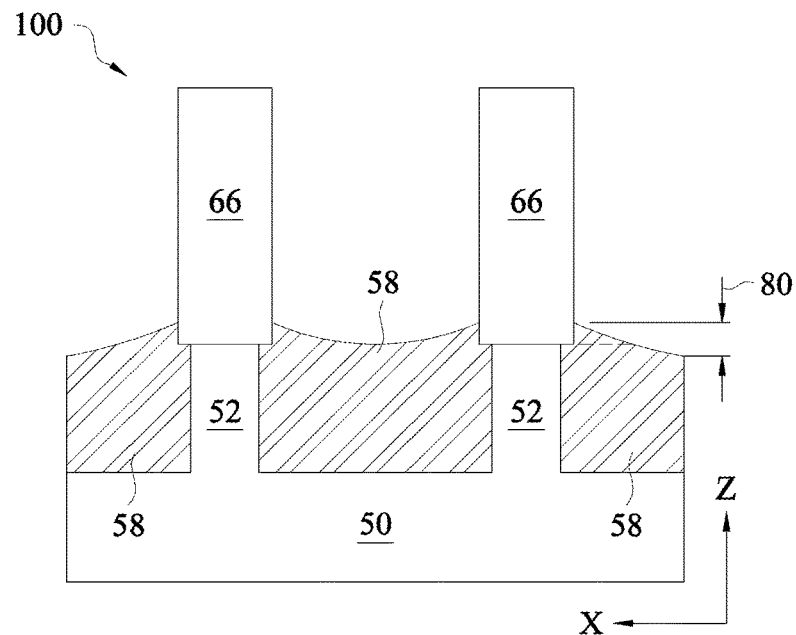

In FIG. 7, n-wells and/or p-wells are formed in the epitaxial fins 66, the fins 52, and/or the substrate 50 in various regions, in some embodiments. For example, a photoresist (not shown) can be formed over the epitaxial fins 66, the fins 52, the substrate 50 and/or the isolation regions 58. The photoresist can be patterned to expose a region of the epitaxial fins 66, the fins 52, and/or the substrate 50, such as an n-channel FET (NFET) region, by using a spin-on technique and acceptable photolithography techniques. Once patterned, a p-type impurity implantation process may be performed in the NFET region. The p-type impurities may comprise boron, $BF_2$, or the like implanted in the NFET region to a concentration of equal to or less than about $7\times10^{18}$ cm$^{-3}$, such as between about $10^{15}$ cm$^{-3}$ and about $7\times10^{18}$ cm$^3$, as examples. After the implantation process, the photoresist may be removed, such as by an acceptable ashing process, which may include an oxygen-containing plasma. Another photoresist (also not shown) may be formed and patterned to expose another region of the epitaxial fins 66, the fins 52, and/or the substrate 50, such as a p-channel FET (PFET) region, using similar techniques, and an n-type impurity implant may be performed in the PFET region. The n-type impurities may comprise phosphorus, arsenic, or the like implanted in the PFET region to a concentration of equal to or less than about $7\times10^{18}$ cm$^{-3}$, such as between about $10^{15}$ cm$^{-3}$ and about $7\times10^{18}$ cm$^{-3}$, as examples. After the implantation process, the photoresist may be removed, such as by an acceptable ashing process. After the implantation processes, an anneal process may be performed to activate the p-type and n-type impurities that were implanted. The implantations may form a p-well in the NFET region and an n-well in the PFET region, for example. In some embodiments, an ashing process or processes can cause increased dishing in the isolation regions 58, such as to a dishing depth 80 of between about 2 nm and about 8 nm, such as about 5 nm, as examples.

A person having ordinary skill in the art will readily understand that the processes described with respect to FIGS. 1 through 7 are examples of how epitaxial fins 66 may be formed. The epitaxial fins 66 may also be formed using other methods. For example, in some embodiments, a dielectric layer can be formed over a top surface of the substrate 50; trenches can be etched through the dielectric layer; homo-epitaxial structures or hetero-epitaxial structures can be epitaxially grown in the trenches; and the dielectric layer can be recessed such that the homo-epitaxial structures or hetero-epitaxial structures protrude from the dielectric layer to form fins. The grown materials may be in situ doped during growth, which may obviate some implantations, although in situ and implantation doping may be used together. Still further, it may be advantageous to epitaxially grow a material in an NFET region different from the material in a PFET region. Other methods may also be used to form the epitaxial fins 66, in other embodiments.

Figure 8:
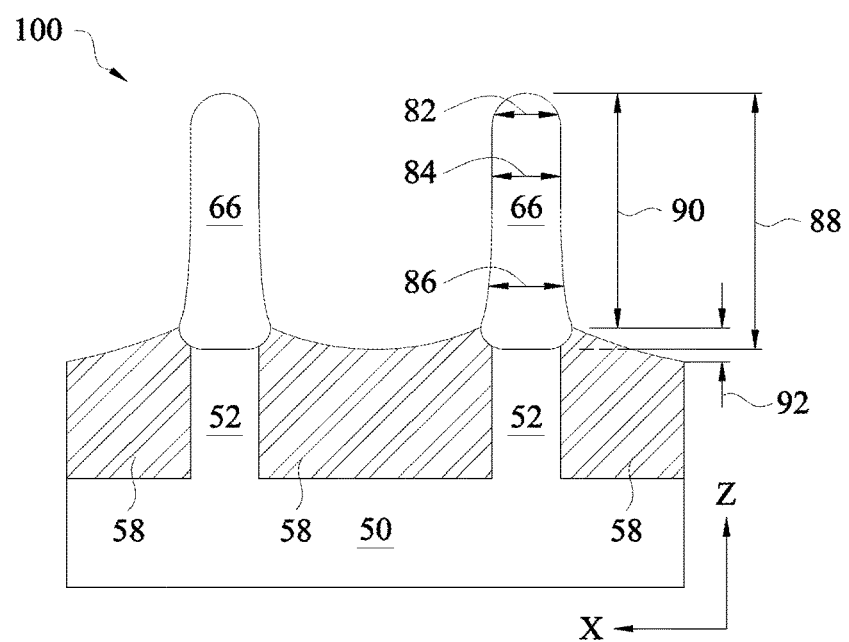

In some embodiments, the epitaxial fins 66 are then reshaped, as shown in FIG. 8. The epitaxial fin 66 reshaping may be performed using a wet cleaning process and a CERTAS® etch, for example. The wet cleaning may comprise an immersion in a solution comprising an etching species. The etching species can comprise ammonium hydroxide ($NH_4OH$), an ammonia peroxide mixture (APM), hydrochloric acid (HCl), dHF, a combination thereof, or the like. The etching species may have a concentration between about 0.2 percent and about 20 percent in the solution. The wet etch can include immersion in the solution from about 20 seconds to about 600 seconds and can be at a temperature of about 20° C. to about 60° C.

The CERTAS® etch can comprise introducing hydrogen fluoride (HF) and ammonia ($NH_3$) as etchants to react with each other and with the oxide present on the epitaxial fins 66 to form $(NH_4)_2SiF_6$ on the surfaces of the epitaxial fins 66. As the $(NH_4)_2SiF_6$ is formed on the surfaces of the epitaxial fins 66, the $(NH_4)_2SiF_6$ will act as a diffusion barrier layer that will prevent the further diffusion of HF and $NH_3$ into the epitaxial fins 66. As such, the CERTAS® etch may be self-limiting, as the formation of $(NH_4)_2SiF_6$ will prevent further formation of $(NH_4)_2SiF_6$ at a deeper depth within the epitaxial fins. The precise depth to which the $(NH_4)_2SiF_6$ will form may be adjusted based on process conditions, such as temperature, pressure, and flow rates of the etchants. Once the reaction has effectively self-terminated, the epitaxial fins 66 (along with the substrate 50) may be heated using an annealing process in order to remove the $(NH_4)_2SiF_6$, thereby reducing the thickness of the epitaxial fins 66 by the thickness of the $(NH_4)_2SiF_6$ and also exposing a remaining portion of the epitaxial fins 66 for further processing. The heat may cause the $(NH_4)_2SiF_6$ to thermally decompose to $N_2$, $H_2O$, $SiF_4$, and $NH_3$, all of which may become vapor and may be removed from the surface of the epitaxial fins 66 by the annealing process. In an embodiment, the annealing process be performed at a temperature of about 80° C. to about 200° C., such as about 100° C., for about 60 seconds to about 180 seconds to remove the $(NH_4)_2SiF_6$. The CERTAS® etch process may be performed multiple times to achieve a desired reshaping effect in some embodiments, for example. Other processes and processing parameters may also be used to reshape the epitaxial fins 66.

As a result of the reshaping in some embodiments, an epitaxial fin 66 height loss may be about 3 nm, and an epitaxial fin 66 width loss may vary, such as by as much as about 6.5 nm. In some embodiments, a width 82 at a depth of about 5 nm from the top of the epitaxial fin 66 is between about 7.6 nm and about 8.4 nm, such as about 8 nm; a width 84 at a depth of about 15 nm from the top of the epitaxial fin 66 is between about 9.4 nm and about 10.6 nm, such as about 10 nm; and a width 86 at a depth of about 30 nm from the top of the epitaxial fin 66 is between about 13 nm and about 15 nm, such as about 14 nm. In some embodiments, the fin height 90, e.g., the portion of the epitaxial fin 66 and/or fin 52 protruding from neighboring isolation regions 58, is between about 31 nm to about 33 nm, such as about 32 nm, and the epitaxial fin height 88 is between about 35 nm to about 37 nm, such as about 36 nm. A difference between the epitaxial fin height 88 and the fin height 90 in some embodiments is greater than about 2 nm. Further, as a result of the reshaping, the isolation regions 58 may have further dishing, and in some embodiments, a dishing depth 92 is between about 6 nm and about 8 nm, such as about 7 nm. The epitaxial fins 66 may also be reshaped by other amounts and other relative amounts.

Figure 9:
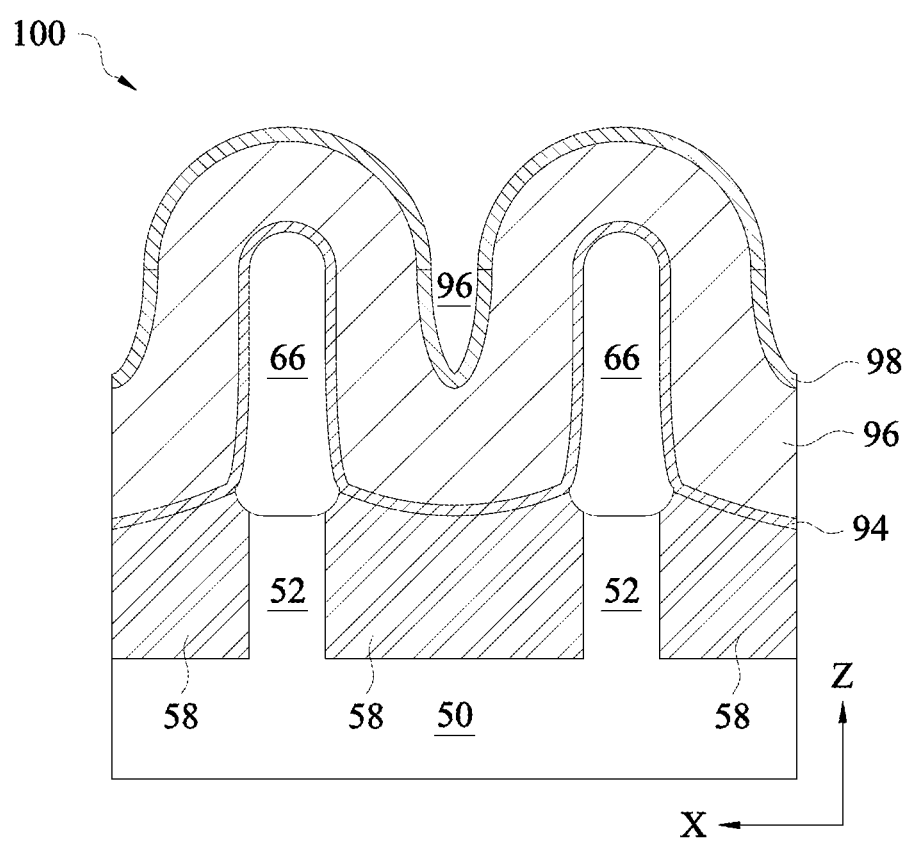

Referring next to FIG. 9, a sacrificial material 94/96/98 is formed over the semiconductor device 100, i.e., over the epitaxial fins 66 and the isolation regions 58 in some embodiments. The sacrificial material 94/96/98 comprises a dummy dielectric layer 94 formed over the epitaxial fins 66 and the isolation regions 58, a dummy gate layer 96 formed over the dummy dielectric layer 94, and a mask layer 98 formed over the dummy gate layer 96. In some embodiments, dummy dielectric layer 94 comprises silicon oxide, silicon nitride, silicon carbon nitride, silicon oxynitride, silicon carbide, silicon oxycarbide, any material that may be removable with a wet etch with selectivity, or the like, as examples. The formation methods of dummy dielectric layer 94 may include atomic layer deposition (ALD), CVD, plasma enhanced CVD (PECVD), a furnace deposition process, thermal oxidation, or the like. The dielectric layer 94 may be conformal to the shape of the underlying epitaxial fins 66 and the isolation regions 58 in some embodiments, as shown. The dummy gate layer 96 may comprise polysilicon or any acceptable sacrificial material. The dummy gate layer 96 may be deposited using CVD, ALD, physical vapor deposition (PVD), the like, or a combination thereof. The dummy gate layer 96 may be conformal to the shape of the underlying dummy dielectric layer 94 in some embodiments, as shown. The mask layer 98 may comprise silicon nitride, silicon oxide, silicon oxynitride, the like, or a combination thereof, and may be deposited using CVD, ALD, PVD, the like, or a combination thereof. The mask layer 98 may be conformal to the shape of the underlying dummy gate layer 96 in some embodiments. In some embodiments, a thickness of the dummy dielectric layer 94 is between about 2 nm and about 6 nm; a thickness of the dummy gate layer 96 is between about 60 nm and about 120 nm; and a thickness of the mask layer 98 is between about 20 nm and about 60 nm, as examples. The sacrificial material 94/96/98 comprising the dummy dielectric layer 94, dummy gate layer 96, and mask layer 98 is also referred to herein collectively as a first sacrificial material 94/96/98, e.g., in some of the claims.

Figure 10A:
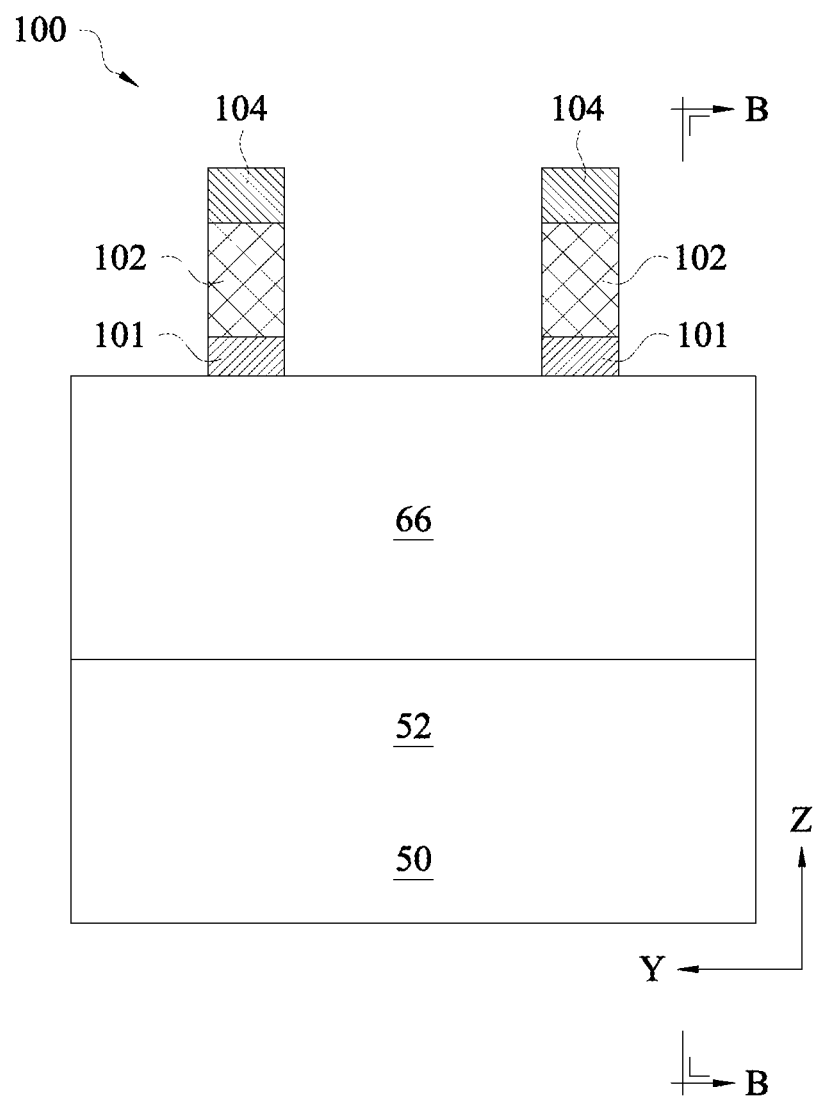
Figure 10B:
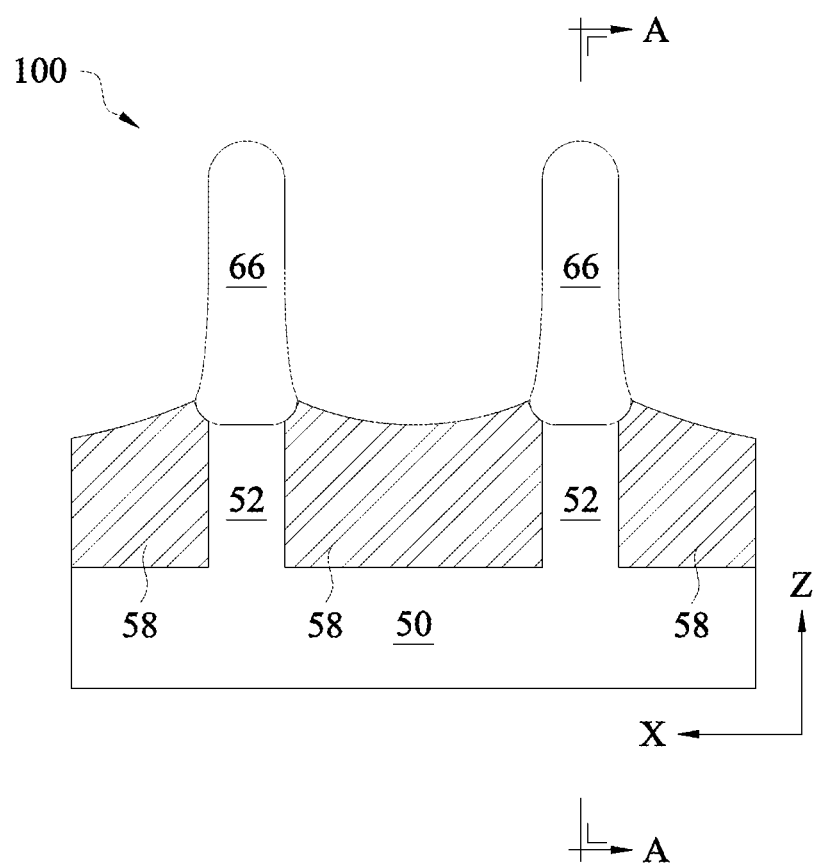

Some of the figures following FIG. 9 illustrate various cross-sectional views during the manufacturing process of the semiconductor device 100. Figures ending in "A" (i.e., FIG. 10A) illustrate a cross-section in a Y-Z plane along an X axis of the substrate 50, and figures ending in "B" (i.e., FIG. 10B) illustrate a cross-section in an X-Z plane along a Y axis of the substrate 50. FIG. 10A illustrates an example cross-section B-B that corresponds to the cross-section used in following figures ending in "B," until indicated otherwise. Similarly, FIG. 10B illustrates an example cross-section A-A that corresponds to the cross-section used in following figures ending in "A," until indicated otherwise. Figures ending in "C" (see FIGS. 11C and 19C) illustrate perspective views of the views shown in the corresponding "A" and "B" figures.

In FIGS. 10A and 10B, the mask layer 98, the dummy gate layer 96, and the dummy dielectric layer 94 are patterned to form masks 104, dummy gates 102, and dummy dielectrics 101, respectively. Two gate structures, each including a dummy dielectric 101 and a dummy gate 102, are illustrated. The patterning may be performed using an acceptable photolithography and etch process(es), such as an RIE, CCP, ICP, the like, or a combination thereof. The etch process may be selective to a desired material and may be anisotropic or isotropic. The gate structures may define respective channel regions of transistors under gate structures and in the epitaxial fins 66, for example. In some embodiments, a width of the gate structures, e.g., in the Y-direction, may be about 30 nm for the discussed technology node, as an example. The gate structures may also be formed using other methods and processing parameters, and may comprise other dimensions.

Figure 11A:
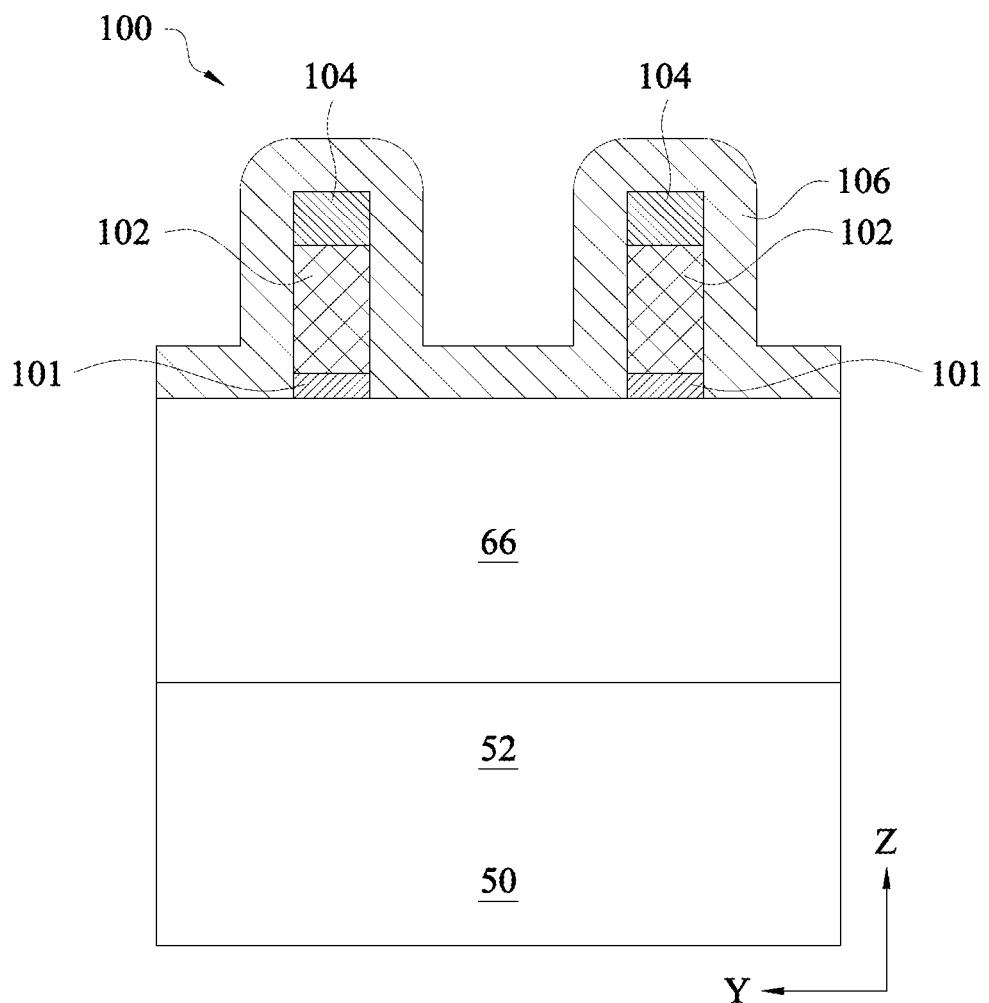
Figure 11B:
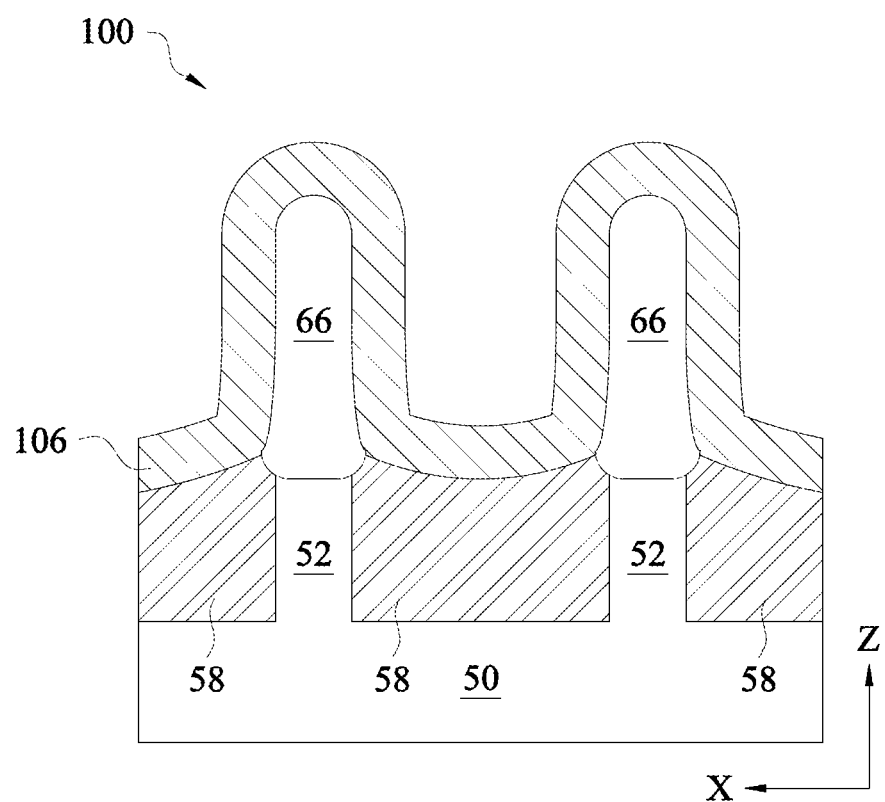
Figure 11C:
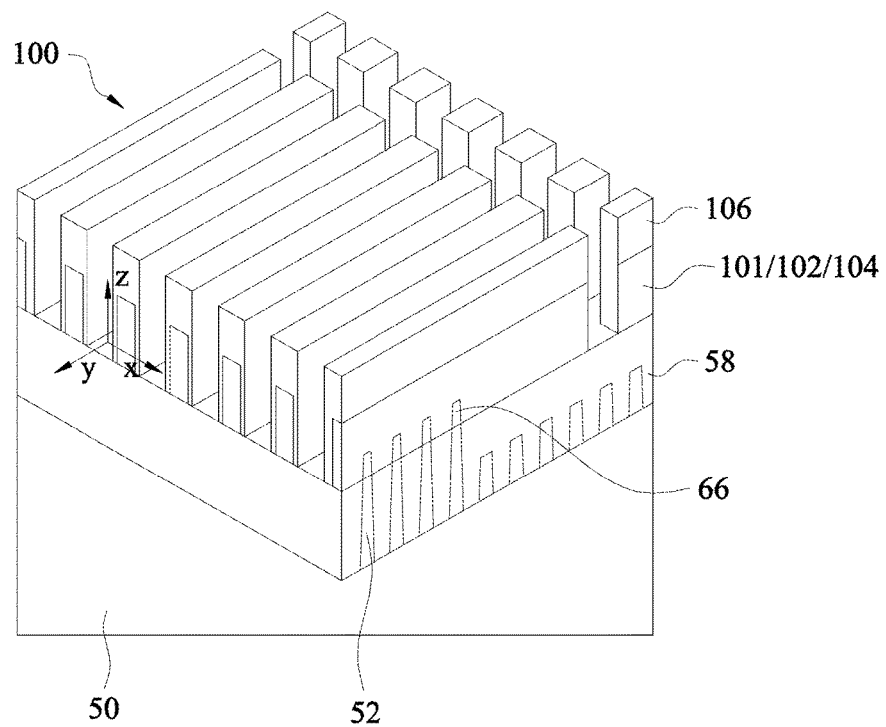
FIG. 11C is a perspective view of the semiconductor device shown in FIGS. 11A and 11B in accordance with some embodiments.

In FIGS. 11A and 11B, a spacer layer 106 is conformally deposited over the semiconductor device 100 structure shown in FIGS. 10A and 10B. The spacer layer 106 is substantially conformal over top surfaces and along sidewall surfaces of the epitaxial fin 66, over a top surface and along sidewall surfaces of the gate structures including the dummy dielectrics 101, dummy gates 102, and masks 104, and over or along top surfaces of the isolation regions 58 in some embodiments. The spacer layer 106 may comprise silicon nitride (SiN), silicon carbon-nitride (SiCN), silicon carbon-oxynitride (SiCON), the like, or a combination or multiple layers thereof, formed by CVD, ALD, the like, or a combination thereof. The spacer layer 106 comprises a bi-layer of two different materials in some embodiments, for example, such as a first layer of SiN and a second layer of SiCN formed over the first layer of SiN. Other combinations of materials can be used to form the bi-layer spacer layer 106. In some embodiments, the spacer layer 106 has a thickness of about 30 Angstroms to about 130 Angstroms, for example. The spacer layer 106 may also comprise other materials, dimensions, and formation methods. FIG. 11C illustrates a perspective view of the semiconductor device 100 shown in FIGS. 11A and 11B.

Figure 12A:
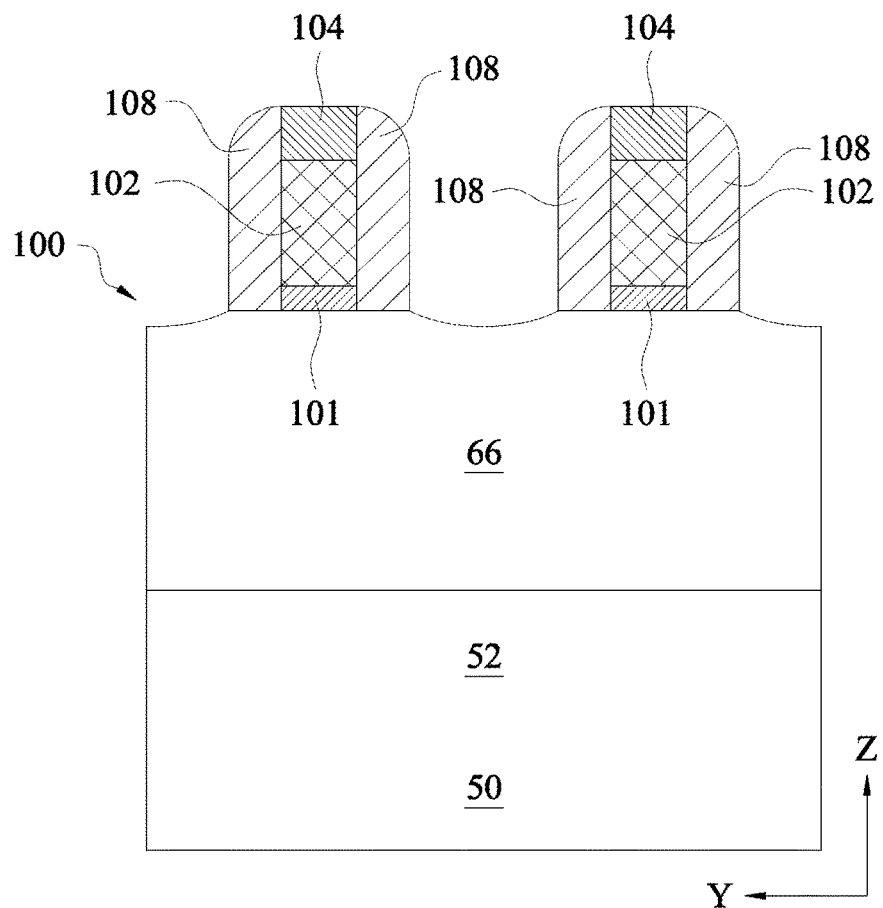
Figure 12B:
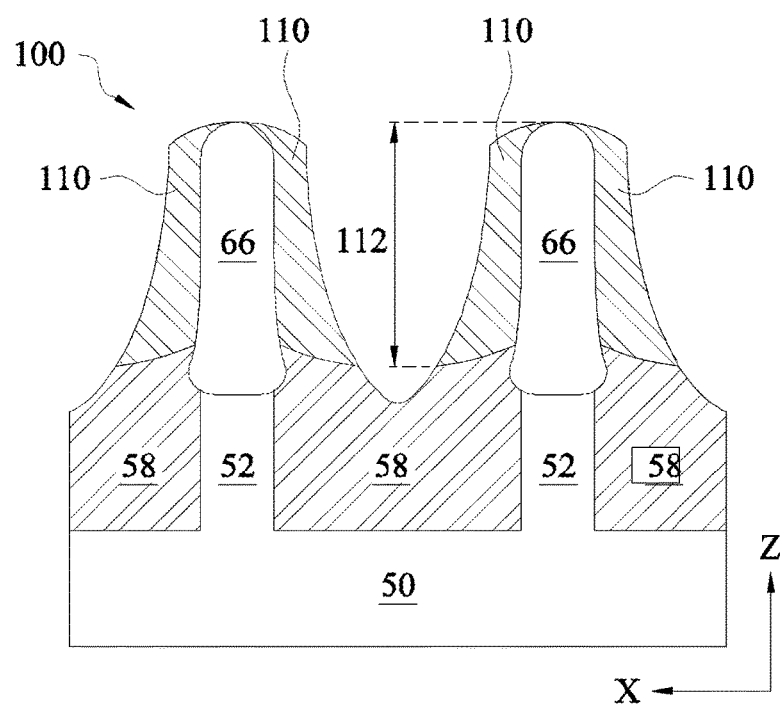

Referring next to FIGS. 12A and 12B, the spacer layer 106 shown in FIGS. 11A and 11B is used as a material layer to form gate spacers and also as a contact etch stop layer (CESL) material in some embodiments. For example, in FIG. 12A, the spacer layer 106 is etched to form gate spacers 108 on sidewalls of the gate structure, e.g., at least adjoining the dummy gates 102. The etch process for the spacer layer 106 comprises an anisotropic etch process in some embodiments, for example. The gate spacers 108 are left remaining on sidewalls of the dummy dielectrics 101, the dummy gates 102, and the masks 104. In FIG. 12B, also as a result of the etch process, barrier portions 110 of the spacer layer 106 are left remaining on sidewalls of the epitaxial fins 66 to function as a CESL in subsequent processing steps, in some embodiments.

The etch process for the spacer layer 106 may comprise an RIE, CCP, ICP, transformer coupled plasma (TCP), a high density plasma (HDP) etch, electron cyclotron resonance (ECR) etch, the like, or a combination thereof, as examples. The etch process may be selective to the spacer layer 106, for example. The etch process is adapted to stop when top surfaces of the epitaxial fins 66 are exposed, in some embodiments. The etch process for the spacer layer 106 may also comprise other types of etch processes and processing parameters.

In some embodiments, the barrier height 112 of the barrier portions 110 of the spacer layer 106 comprises about 15 nm to about 45 nm, such as about 39 nm, and widths of the gate spacers 108 in the Y-direction, are between about 8 nm and about 10 nm, such as about 9 nm. The barrier height 112 may also comprise other dimensions and may vary as a function of the height of the epitaxial fins 66, for example. In addition, the etching process may result in a slight loss of some material of the epitaxial fins 66 and the isolation regions 58, such as a few nm.

Figure 13A:
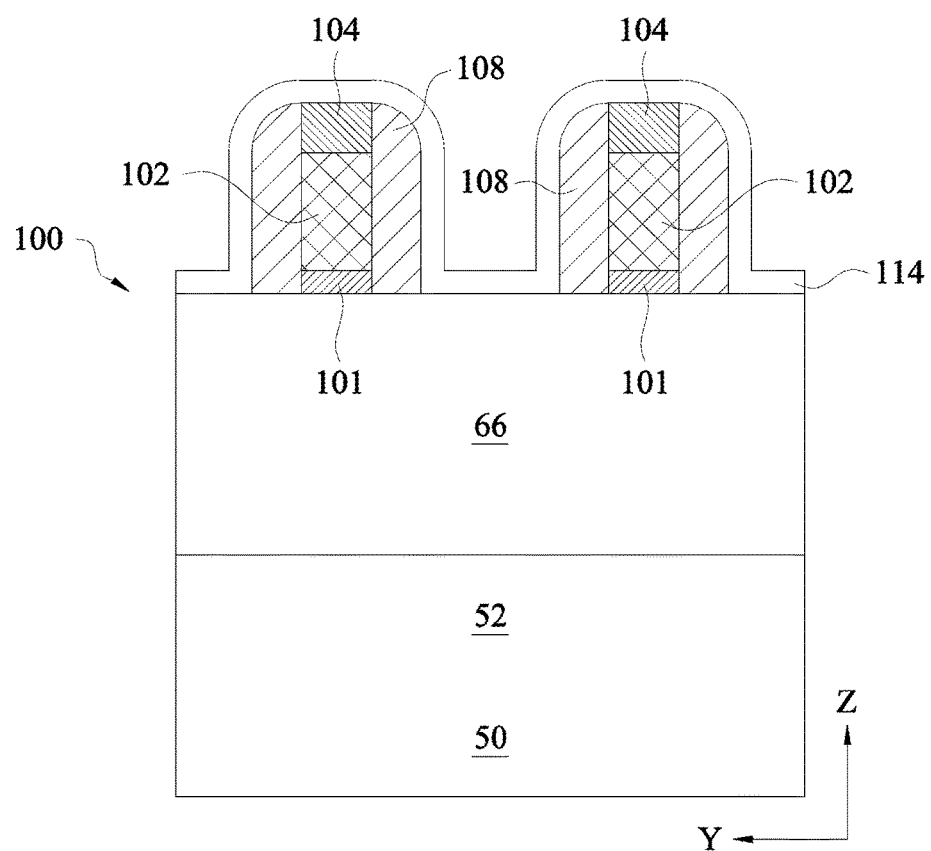
Figure 13B:
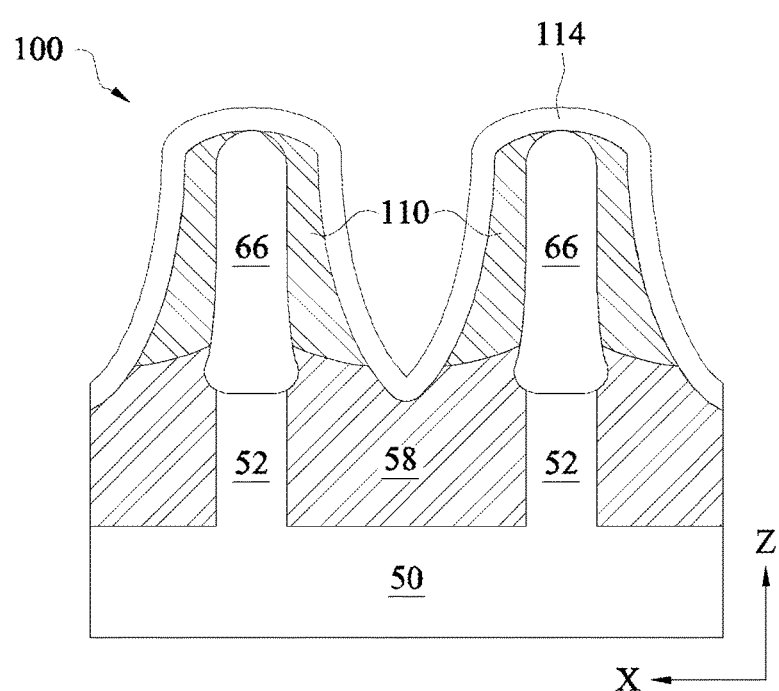

Referring next to FIGS. 13A and 13B, a sacrificial material 114 is formed over the top surfaces of the masks 104, top surfaces of the epitaxial fins 66, top surfaces of the isolation regions 58, and top surfaces and sidewalls of the gate spacers 108 and the barrier portions 110 of the spacer layer 106. The sacrificial material 114 is also referred to herein, e.g., in some of the claims, as a second sacrificial material 114. The sacrificial material 114 comprises a material with an etch selectivity to the material of the gate spacers 108 and the barrier portions 110 of the spacer layer 106 in some embodiments, for example. The sacrificial material 114 comprises a conformal material; for example, the topography of the semiconductor device 100 is substantially evenly coated with the sacrificial material 114. In some embodiments, the sacrificial material 114 comprises silicon dioxide ($SiO_2$), an oxide doped with phosphorous, an oxide doped with boron, or combinations or multiple layers thereof. The sacrificial material 114 may have a thickness of about 50 Angstroms to about 100 Angstroms, as examples. The sacrificial material 114 may be formed using PEALD, PECVD, ALD, or CVD, as examples. The sacrificial material 114 may also comprise other materials, dimensions, and formation methods.

Figure 14A:
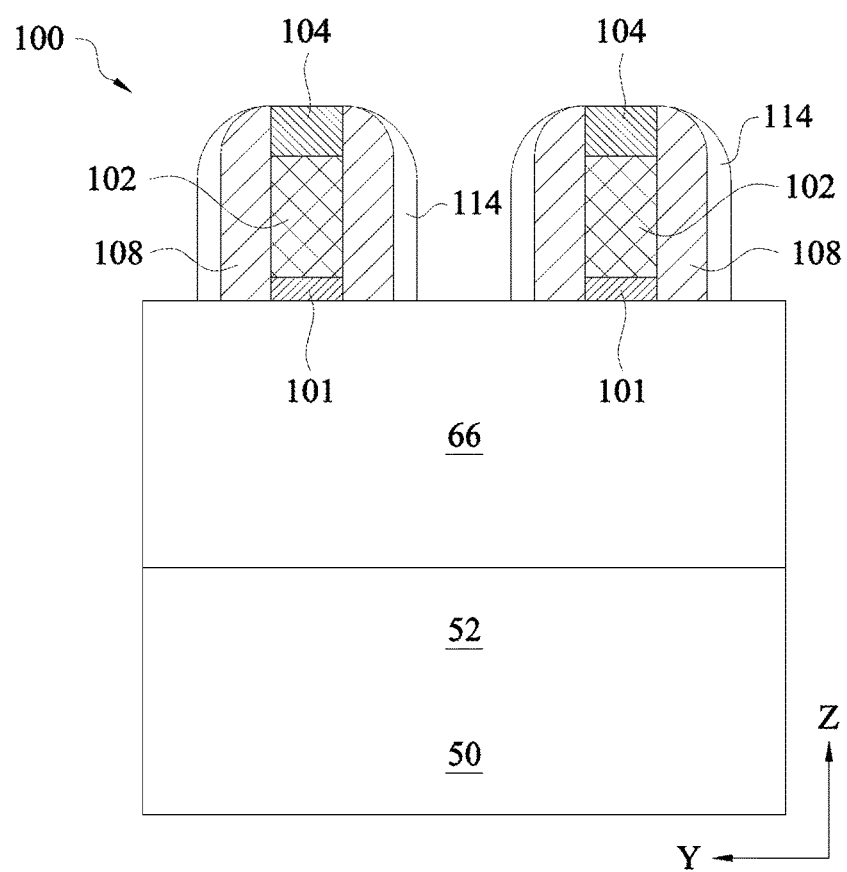
Figure 14B:
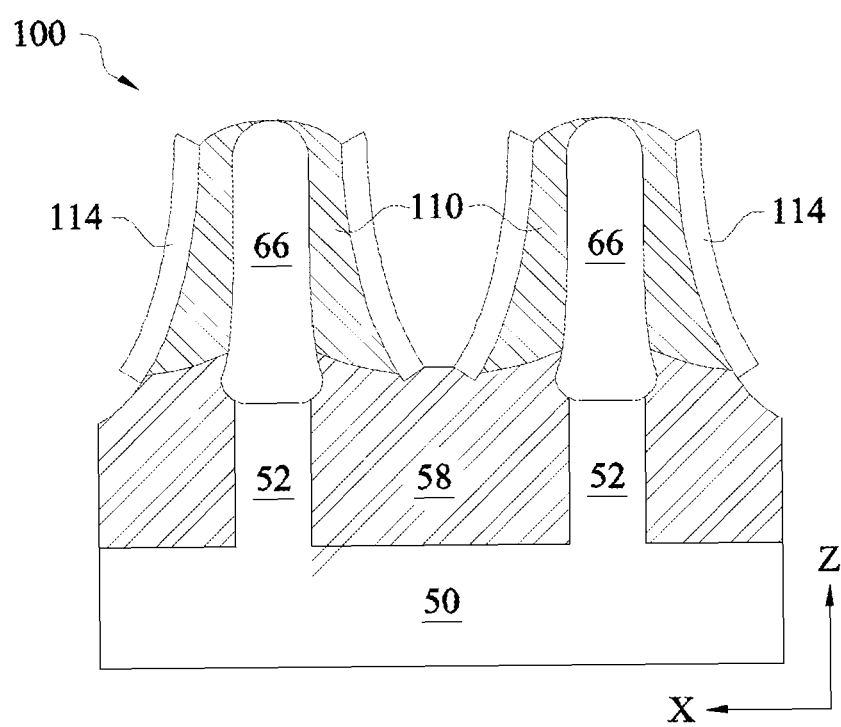

In FIGS. 14A and 14B, the sacrificial material 114 is etched using an anisotropic etch process. The etch process may comprise a similar etch process such as an etch process described for the spacer material 106, for example. The etch process may also comprise a different type of etch process than the etch process used for the spacer layer 106. The material of the sacrificial material 114 is different than the material of the spacer layer 106 to provide etch selectivity; thus, the etch processes for the spacer layer 106 and the sacrificial material 114 comprise different chemistries in some embodiments. The sacrificial material 114 is removed from top surfaces of the epitaxial fins 66 and the masks 104 in FIG. 14A and from top surfaces of the barrier portions 110, isolation regions 58, and epitaxial fins 66 in FIG. 14B. The sacrificial material 114 is left remaining on sidewalls of the gate spacers 108 and the barrier portions 110 after the etch process.

In some embodiments, a portion of the sacrificial material 114 is left remaining after the anisotropic etch process between the epitaxial fins 129 in FIG. 14B, which will be described further herein with reference to FIG. 23B.

Figure 15A:
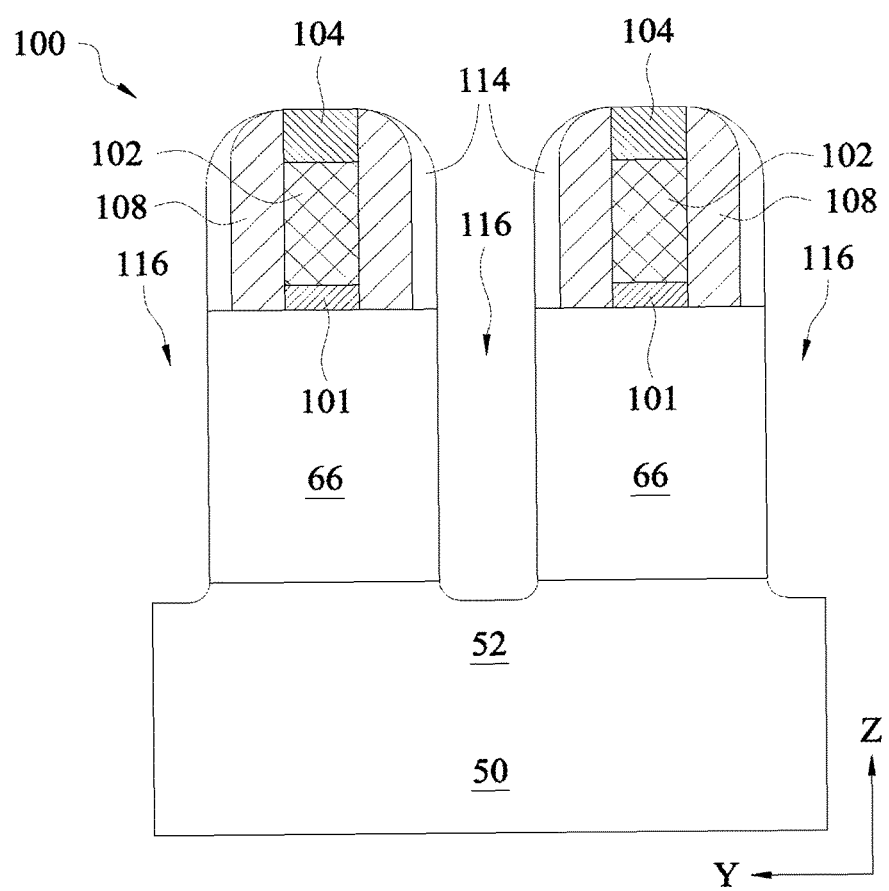
Figure 15B:
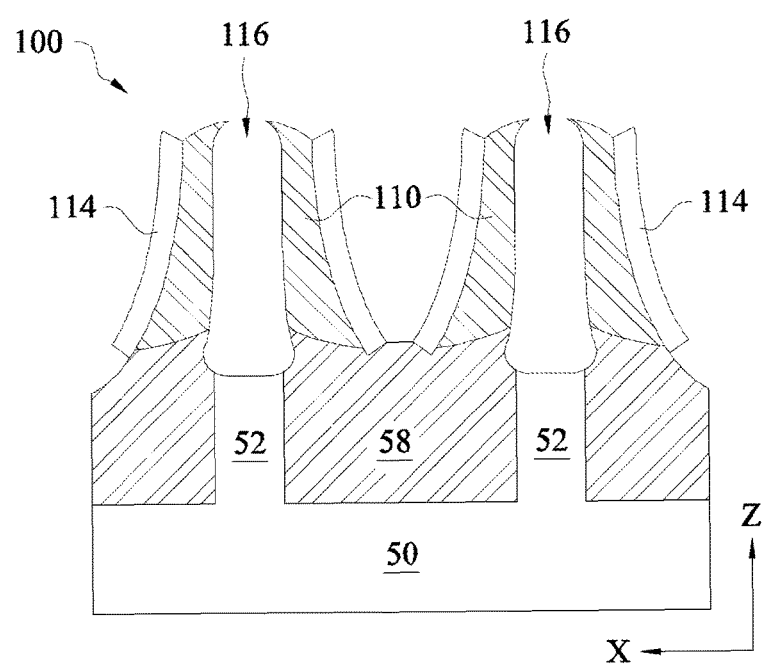

Referring next to FIGS. 15A and 15B, portions of the epitaxial fins 66 are recessed using an etch process, such as an isotropic etch process, to form recesses 116. The etch process may comprise RIE, NBE, TMAH, $NH_4OH$, a wet etchant capable of etching the recesses 116 with good etch selectivity between a material(s) of the epitaxial fins 66 and a material of the isolation regions 58, the sacrificial material 114, and the barrier portions 110, the like, or a combination thereof. The recesses 116 may extend to a depth that is above, to, or below an interface between the epitaxial fins 66, fins 52, or the substrate 50. In the illustrated embodiments, a surface of the fins 52 defines a bottom surface of the recesses 116, although in other embodiments, a surface of the epitaxial fins 66 or the substrate 50 can define a bottom surface of the recess 116. In some embodiments, all of the exposed epitaxial fin 66 material is removed during the recessing process. The recesses 116 are also defined in part by the barrier portions 110 and portions of isolation regions 58 in FIG. 15B.

Figure 16B:
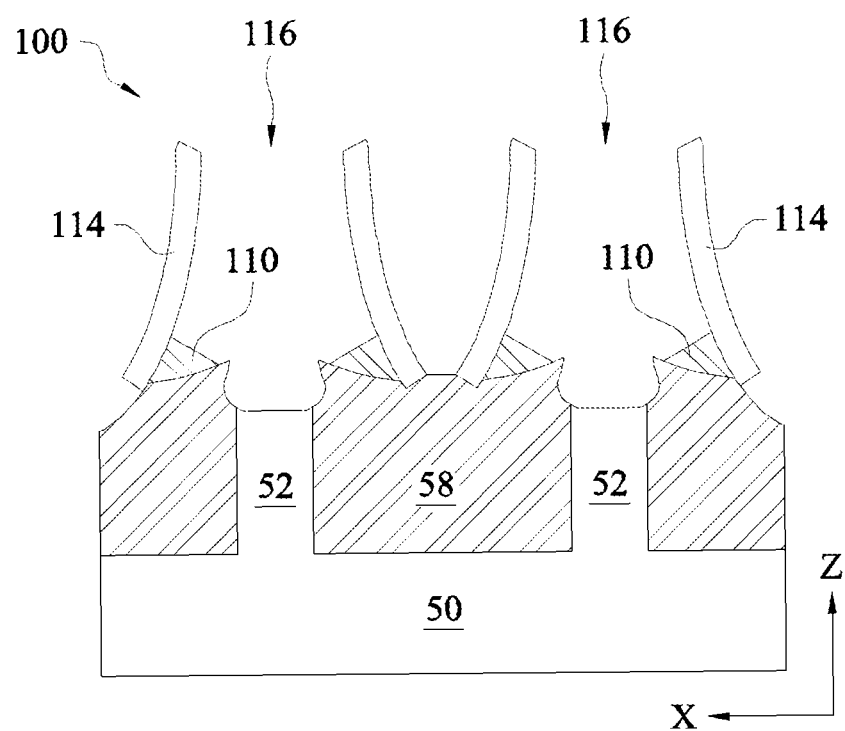

In FIG. 16B, at least a top portion of the barrier portions 110 is removed using an etch process adapted to selectively etch a material of the barrier portions 110. In some embodiments, all of the barrier portions 110 are removed (not shown in FIG. 16B; see FIGS. 20B and 23B). The gate spacers 108 are covered by the sacrificial material 114 and are thus not removed. In some embodiments, a top portion of the gate spacers 108 is exposed; however, the height of the topography of the gate spacers 108 is greater than the height of the barrier portions 110 and the opening is also narrower, so the barrier portion 110 material etches at a faster rate than the gate spacers 108. Thus, the Y-Z view shown in FIG. 15A remains substantially the same, in some embodiments. In other words, the semiconductor device 100 shown in FIG. 15A is not substantially changed in the etch process illustrated in FIG. 16B.

Figure 23B:
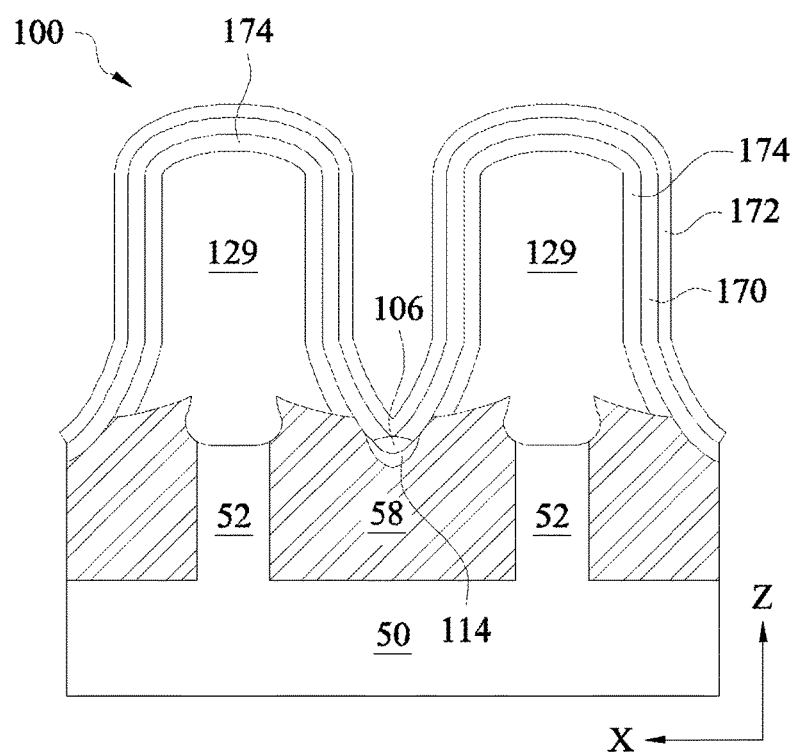
FIG. 23B is a cross-sectional view that illustrates a semiconductor device in accordance with some embodiments.

In some embodiments, a small portion of the spacer layer 106 may be left residing over the isolation regions 58 after the removal of the portions of the barrier portions 110 (not shown in FIG. 16B; see FIG. 23B at 106). The portion of the spacer layer 106 comprises a material of gate spacers 108 on a gate electrode (also not shown in FIG. 16B; see gate electrode 162 shown in FIG. 19A), to be described further herein. If a portion of the sacrificial material 114 is left remaining over the isolation regions 58 after the anisotropic etch process of the sacrificial material 114 in FIG. 14B, the portion of the spacer layer 106 is disposed over the portion of the sacrificial material 114, which comprises an oxide in some embodiments. In other embodiments, a portion of the sacrificial material 114 is not left residing over the epitaxial fins 129 after the anisotropic etch process of the sacrificial material in FIG. 14B, and the portion of the spacer layer 106 is left remaining directly over the isolation regions 58, not shown. In yet other embodiments, no portion of the spacer layer 106 is left remaining over the isolation regions 58 after the removal of the barrier portions 110, as illustrated in FIG. 16B.

Figure 17B:
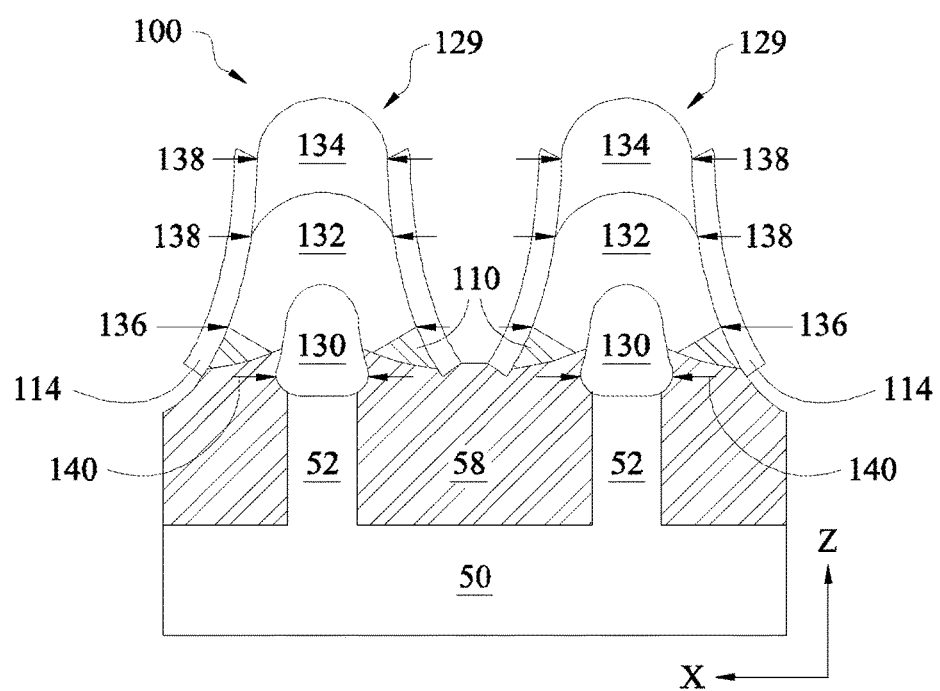

In FIG. 17B, an epitaxial material 129 is then grown in the recesses 116. The epitaxial material 129 is also grown in recesses 116 in the view shown in FIG. 15A; see FIG. 18A. In some embodiments, a cleaning step may be used before the epitaxial growth of the epitaxial material 129. The epitaxial material 129 is also referred to herein as epitaxial fins 129, second epitaxial fins 129 (e.g., when also referring to first epitaxial fins 66), or as first and second epitaxial fins 129, e.g., after the removal of epitaxial fins 66 and in some of the claims.

The epitaxial material 129 comprises first epitaxial regions 130, second epitaxial regions 132 disposed over the first epitaxial regions 130, and third epitaxial regions 134 disposed over the second epitaxial regions 132 in some embodiments, as described in the related patent application Ser. No. 14/257,809, filed on Apr. 21, 2014 and entitled, "Wrap-Around Contact," which application is incorporated herein. The first epitaxial regions 130 are grown from crystalline surfaces of the recesses 116, e.g., from the surfaces of the fins 52 in FIG. 17B and from the surfaces of the fins 52 and the epitaxial fins 66 in FIG. 18A. The second epitaxial regions 132 are grown from the first epitaxial regions 130, and the third epitaxial regions 134 are grown from the second epitaxial regions 132.

The sacrificial material 114 advantageously defines and controls the growth of the second epitaxial regions 132 and at least a lower portion of the third epitaxial regions 134 along the X-direction, as illustrated in FIG. 17B. An upper portion of the third epitaxial regions 134 does not extend substantially beyond the sacrificial material 114 in the X-direction and Y-direction. Thus, as illustrated, the epitaxial material 129 comprises a substantially pillar shape in the upper portion. For example, the upper portion of the epitaxial material 129, such as the third epitaxial regions 134 and the second epitaxial regions 132, comprises a substantially pillar shape.

The epitaxial material 129 comprises epitaxial fins that comprise portions of source and drain regions of a FinFET device in some embodiments. The epitaxial material 129 is disposed over the fins 52 and over portions of the barrier portions 110, in some embodiments wherein the portions of the barrier portions 110 are left remaining over the isolation regions 58, as illustrated in FIG. 17B. In some embodiments wherein all of the barrier portion 110 material is removed, the epitaxial material 129 is disposed over the fins 52 and over portions of the isolation regions 58, as shown in FIGS. 20B and 23B.

In some embodiments, a semiconductor device 100 comprises a substrate 50 comprising a first fin 52 and a second fin 52 (e.g., such as the left fin 52 and right fin 52, respectively, in the view shown in FIG. 17B). The semiconductor device 100 includes a first epitaxial fin 129, e.g., such as the left epitaxial fin 129, disposed over the first fin 52. The semiconductor device 100 also includes a second epitaxial fin 129, e.g., such as the right epitaxial fin 129, disposed over the second fin 52. The second fin 52 is proximate the first fin 52. For example, the second fin 52 is the closest neighboring fin to the first fin 52. Likewise, the second epitaxial fin 129 is proximate the first epitaxial fin 129. For example, the second epitaxial fin 129 is the closest neighboring epitaxial fin to the first epitaxial fin 129. The first epitaxial fin 129 and the second epitaxial fin 129 comprise an upper portion comprising a substantially pillar shape.

In other embodiments, the fins 52 and the epitaxial fins 129 comprise source and drain regions of a FinFET device. For example, a first epitaxial fin 129 such as the left epitaxial fin 129 shown in FIG. 17B has an upper portion comprising a substantially pillar shape and is disposed over a first (left) fin 52. The first fin 52 and the first epitaxial fin 129 comprise a source region. A second epitaxial fin 129 such as the right epitaxial fin 129 shown in FIG. 17B also has an upper portion comprising a substantially pillar shape and is disposed over the second (right) fin 52. The second fin 52 and the second epitaxial fin 129 comprise a drain region. The left fins 52/129 may also comprise a drain region, and the right fins 52/129 may also comprise a source region, for example.

In some embodiments, the epitaxial material 129 comprises a larger width 136 proximate a middle portion and a smaller width 138 proximate an upper portion. The middle portion width 136 of the epitaxial material 129 is also referred to herein as a first width 136, and the upper portion width 138 of the epitaxial material 129 is also referred to herein as a second width 138, e.g., in some of the claims. The first width 136 is greater than the second width 138 in some embodiments. The first width 136 comprises about 20 nm to about 36 nm, and the second width 138 comprises about 12 nm to about 28 nm in some embodiments. The epitaxial material 129 comprises a third width 140 proximate a lower portion. The third width 140 is less than the first width 136 in some embodiments. The third width 140 is also less than the second width 138 in some embodiments. The third width 138 comprises about 10 nm to about 28 nm in some embodiments, for example. The third width 138 may vary as a function of the fin 52 width and target epitaxial fin 129 side, for example. The first width 136, the second width 138, and the third width 140 may also comprise other values. The middle portion is disposed between the upper portion and the lower portion, and does not necessarily comprise a central portion, although it may. The first width 136 and the second width 138 may be decreased as semiconductor devices 100 are scaled down in size, and the space between adjacent fins comprised of the epitaxial material 129 may also be decreased. Advantageously, because of the pillar shape of the epitaxial material 129 in the cross-sectional view (rather than a rhombus or diamond-shape in a cross-sectional view, for example), the source and drain regions of a FinFET device may be placed closer together.

In some embodiments, the epitaxial fins 129 comprise a substantially mushroom shape in a cross-sectional view, with first epitaxial regions 130 being narrower in width than the second and third epitaxial regions 132 and 134. The narrower first epitaxial regions 130 form a "stem" of the mushroom shape, for example. In some embodiments, upper portions of the epitaxial fins 129 may have substantially straight sidewalls; e.g., an upper portion of the second epitaxial regions 132 may substantially comprise the second width 138 of the third epitaxial regions 134, as illustrated in FIG. 17B.

The first epitaxial regions 130 of the epitaxial material 129 may have a thickness of between about 8.5 nm and about 11.5 nm, such as about 10 nm in some embodiments. The second epitaxial regions 132 may have a thickness of between about 10 nm and about 20 nm, such as about 15 nm. The third epitaxial regions 134 may have a thickness of between about 33.5 nm and about 36.5 nm, such as about 35 nm. The first epitaxial regions 130, the second epitaxial regions 132, and the third epitaxial regions 130 of the epitaxial material 129 may also comprise other dimensions.

The first epitaxial regions 130, second epitaxial regions 132, and third epitaxial regions 134 of the epitaxial material 129 may comprise silicon, silicon carbide, germanium, a III-V compound semiconductor, a II-VI compound semiconductor, or the like. For example, the available materials for forming a III-V compound semiconductor include, but are not limited to, InAs, AlAs, GaAs, InP, GaN, InGaAs, InAlAs, GaSb, AlSb, AlP, GaP, and the like. The first epitaxial regions 130, second epitaxial regions 132, and third epitaxial regions 134 may be epitaxially grown using MOCVD, MBE, LPE, VPE, SEG, the like, or a combination thereof. In some embodiments, one or more of the first epitaxial regions 130, second epitaxial regions 132, and third epitaxial regions 134 may be omitted, or additional epitaxial regions may be added.

The first epitaxial regions 130, second epitaxial regions 132, and third epitaxial regions 134 of the epitaxial material 129 may further be doped to appropriate concentrations. The doping may be implemented by implantation and/or may be implemented by in situ doping during growth, for example. The dopants may include boron, indium, or the like for a p-type transistor, and may include phosphorus, arsenic, or the like for an n-type transistor, as examples. Other embodiments may not include a doping step.

Figure 18A:
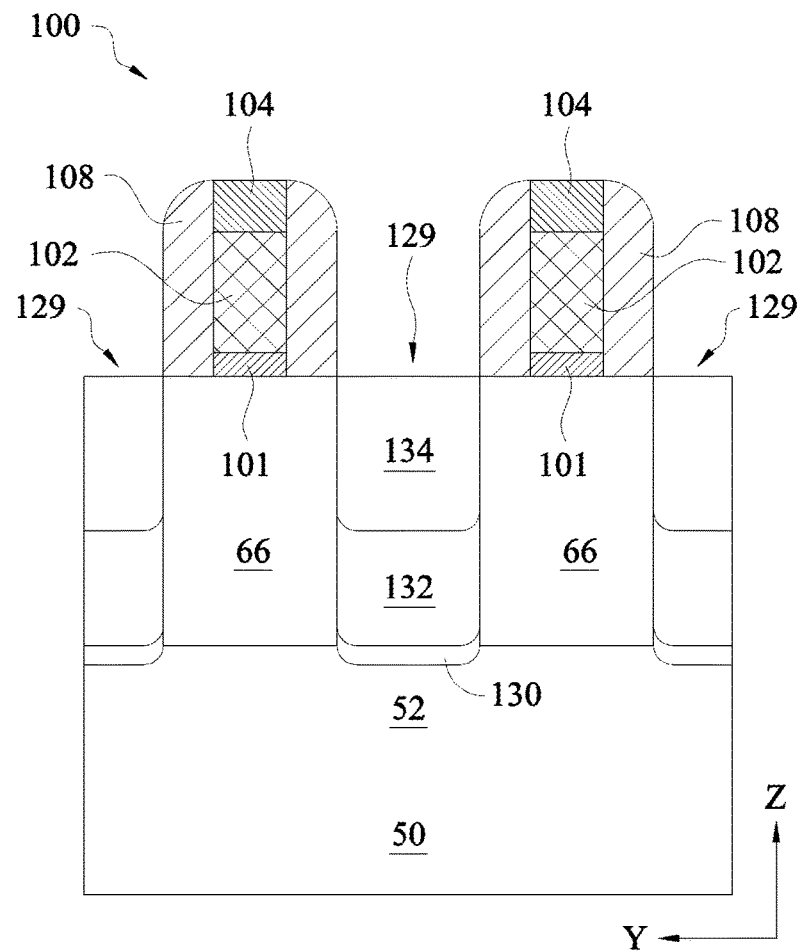
Figure 18B:
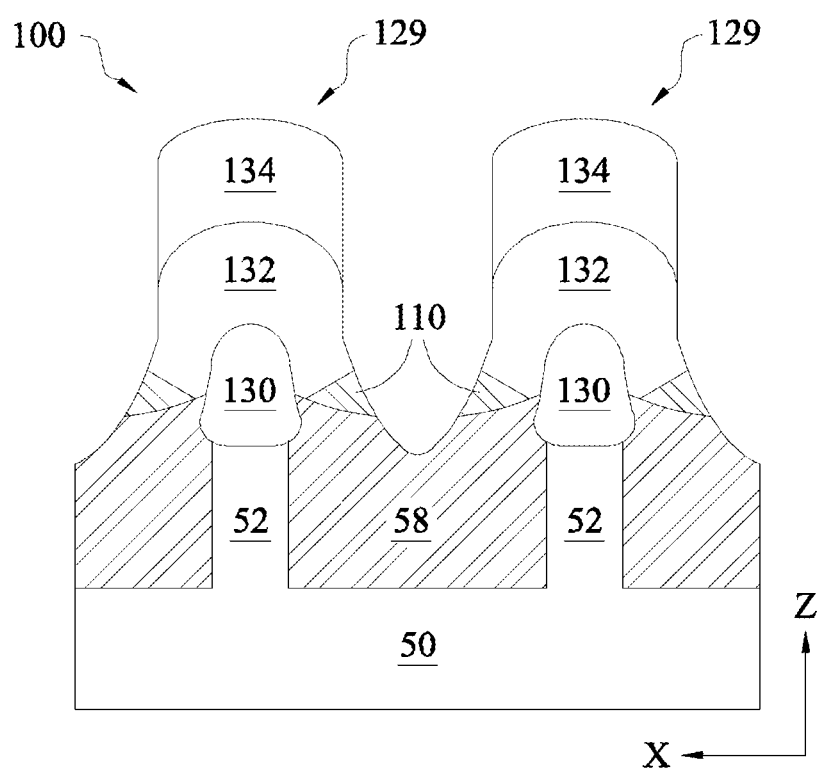

The epitaxial material 129 is also formed in the recesses 116 in the Y-Z plane, as shown in FIG. 18A. The sacrificial material 114 is then removed using an etch process, also shown in FIGS. 18A and 18B. A portion of the barrier portion 110 of the spacer layer 106 is left remaining beneath edges of the epitaxial fins 129, e.g., beneath the widest portions of the epitaxial fins 129. The portion of the barrier portion 110 of the spacer layer 106 comprises a residue that advantageously functions as a seal for the epitaxial fins 129 disposed over the isolation regions 58 in some embodiments.

Figure 19A:
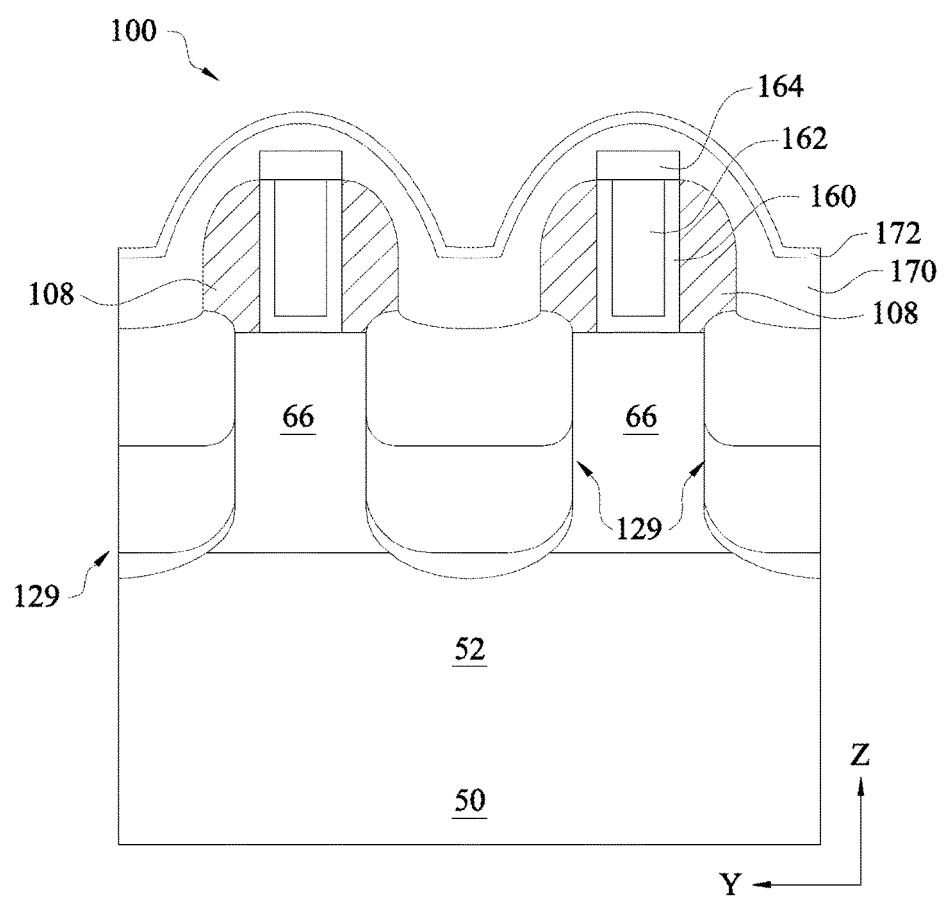

Processing of the semiconductor device 100 is then continued to complete the manufacturing process. For example, the first sacrificial material 101/102/104 is removed, and a gate dielectric 160 and gate material 162 are formed to fill the spaces between the sidewall spacers 108 where the first sacrificial material 101/102/104 was located, as shown in FIG. 19A and as described in the related application. An inter-layer dielectric (ILD) material (not shown in FIG. 19A; see ILD material 168 shown in FIG. 19C) and a replace gate (RPG) procedure may be implemented, as described in the related application, for example.

For example, the first sacrificial material 101/102/104 comprising the masks 104, dummy gates 102, and dummy dielectrics 101 are removed in an etching step(s), so that recesses are formed. Each recess exposes a channel region of a respective epitaxial fin 66. Each channel region is disposed between neighboring sets of the epitaxial material 129 comprising a first epitaxial region 130, a second epitaxial region 132, and a third epitaxial region 134.

The gate dielectric 160 is deposited conformally in the recesses, such as on the top surfaces of the epitaxial fins 66 and on sidewalls of the gate spacers 108. In accordance with some embodiments, the gate dielectric 160 comprises silicon oxide, silicon nitride, or multilayers thereof. In other embodiments, the gate dielectric 160 comprises a high-k dielectric material, and in these embodiments, the gate dielectric 160 may have a k value greater than about 7.0, and may include a metal oxide or a silicate of Hf, Al, Zr, La, Mg, Ba, Ti, Pb, and combinations thereof, as examples. The formation methods of gate dielectric 160 may include molecular-beam deposition (MBD), ALD, PECVD, and the like, as examples. The gate dielectric 160 may also comprise other materials and may be formed using other methods.

Next, the gate electrode 162 is deposited over the gate dielectric 160 and substantially fills the remaining portions of the recesses. The gate electrode 162 may comprise a metal-containing material such as TiN, TaN, TiC, TaC, Co, Ru, Al, W, TiSiN, TaAlC, TiAlC, a combination thereof, or multi-layers thereof, and may be deposited by PVD, CVD, ALD, the like, or a combination thereof. The gate electrode 162 may also comprise other materials and may be formed using other methods.

After the filling of the gate electrode 162 material, a CMP process and/or etch process may be performed to remove excess portions of the gate dielectric 160 and the gate electrode 162 from over top surfaces of the gate spacers 108 and other surfaces of the semiconductor device 100, leaving the gate dielectric 160 and gate electrode 162 remaining in regions where the first sacrificial material 101/102/104 was removed from, over the channel regions of the epitaxial fins 66, as shown in FIG. 19A. The resulting remaining gate electrodes 162 and gate dielectrics 160 thus form replacement gates of FinFET devices formed on the semiconductor device 100.

Self-aligned contacts (SACs) 164 are formed over the gate material 162 and gate dielectric 160 in some embodiments, e.g., using a silicide process. The SACs 164 may also be formed using other methods. The SACs 164 comprise a material such as SiN, SiCN, or multiple layers thereof having a thickness of about 8 nm to about 25 nm, for example. The SACs 164 comprise nitride caps on the metal gates 162 that function to prevent subsequently deposited metallization layers from shorting with the gates 162 in some embodiments, for example. The SACs 164 are later removed in a subsequent process step from over the source and drain regions 52/129, e.g., in a CMP step and/or an ILD material 168 etch used for contact formation, as an example. The SACs 164 may also comprise other materials, dimensions, and formation methods.

Figure 19B:
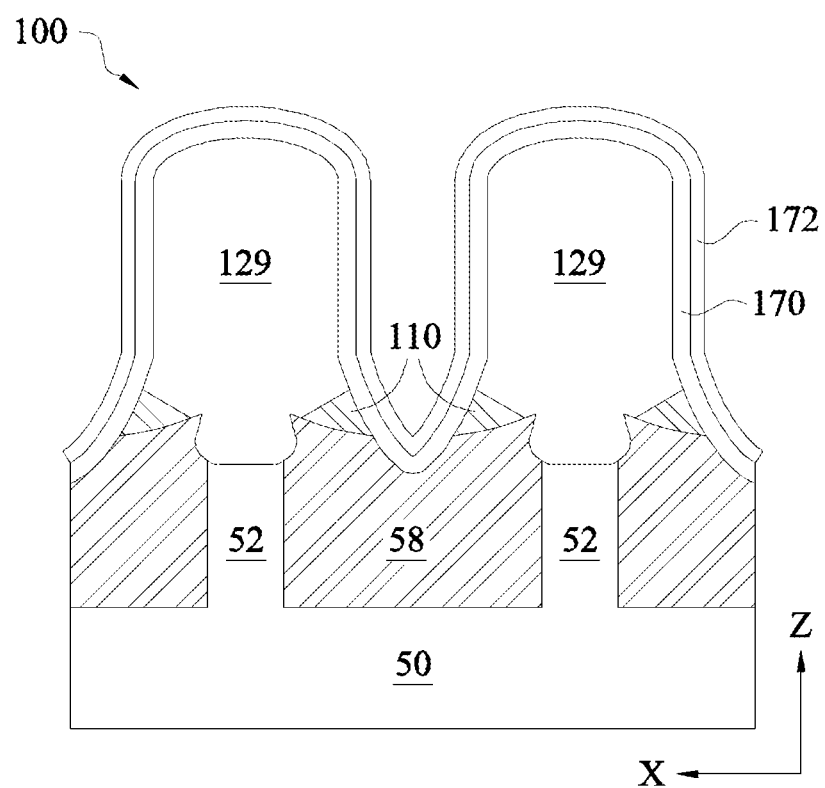

A contact material 170/172 is then formed over the semiconductor device 100, as shown in FIGS. 19A and 19B. The contact material 170/172 comprises a first layer 170 of Ti and a second layer 172 that includes W in some embodiments. The first layer 170 may comprise Ti, Ta, Ni, Co, Al, or combinations or multiple layers thereof having a thickness of about 0 nm to about 3.5 nm, as examples. The first layer 170 is not included in some embodiments, for example. The second layer 172 may comprise TaN, WN, WSiN, MoW, TiSiN, TiN, or combinations or multiple layers thereof comprising a thickness of about 2 nm to about 10 nm, as examples. The second layer 172 comprises a glue layer for a subsequently deposited material layer in some embodiments, for example. The contact material 170/172 may also comprise a single layer or three or more layers, and the contact material 170/172 may also comprise other materials and dimensions. The contact material 170/172 may be formed by CVD or other methods.

Figure 19C:
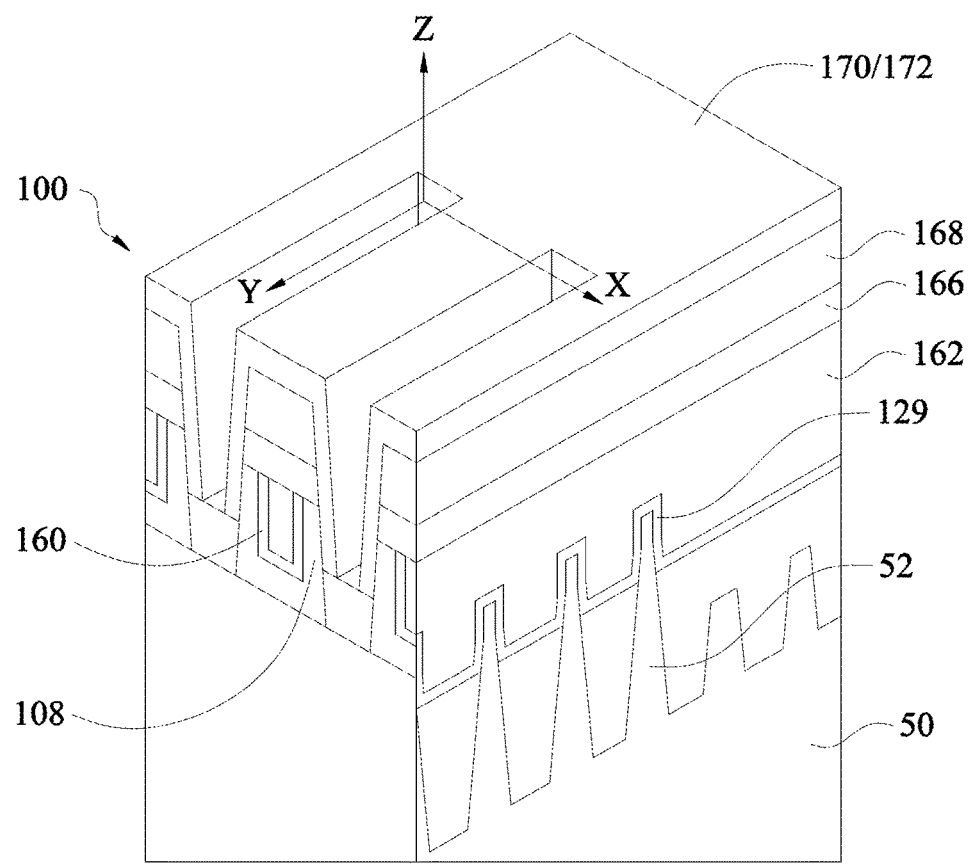
FIG. 19C is a perspective view of the semiconductor device shown in FIGS. 19A and 19B in accordance with some embodiments.

A perspective view of the semiconductor device 100 illustrated in FIGS. 19A and 19B is shown in FIG. 19C. An etch stop layer (ESL) 166 comprising a nitride material such as SiN or other materials having a thickness of about 100 Angstroms to about 300 Angstroms, such as about 200 Angstroms, is disposed over the gate electrodes 162, gate dielectrics 160, and gate spacers 108. The ILD material 168 having a thickness of about 300 Angstroms to about 500 Angstroms, such as about 400 Angstroms, is disposed over the ESL 166. The ESL 166 and the ILD material 168 are not shown in FIG. 19A and other cross-sectional views of the drawings of the present disclosure, to simplify the drawings.

In some embodiments, the contact material may comprise a silicide material, a germanide material, a III-V metal alloy material, a metal-insulator-semiconductor contact, or combinations or multiple layers thereof, as examples. The contact material of the semiconductor device 100 may include the first layer 170, the second layer 172, a silicide or germanide 174, a cap layer 176 which may comprise a fourth epitaxial layer in some embodiments disposed over the third epitaxial layer 134 (see FIG. 18B), or multiple layers or combinations thereof, which will be described further herein in reference to FIGS. 20A, 20B, 20D, 21A, 21B, 22A, 22B, and 23B.

The contact material 170/172 (or contact material 170/172/174/[and/or] 176) is then patterned (not shown) with a desired pattern for contacts to the gate material 162 and wrap-around contacts for the source and drain regions 52/129 comprising the epitaxial material 129. The contacts formed from the contact material 170/172 may be self-aligned, such as by performing a CMP process on the contact material 170/172, wherein the CMP process is adapted to stop on the SACs 164, for example. The pillar-shaped upper portions of the epitaxial fins 129 of the source and drain regions 52/129 advantageously results in a fully wrapped wrap-around contact (WAC) for the source and drain regions 52/129, as shown in FIG. 19B.

After the manufacturing process for the semiconductor device 100 described herein, additional material layers may be deposited, such as insulating materials, conductive material layers, contact pads, and other elements (also not shown) to complete the fabrication of the semiconductor device 100. For example, an additional ILD material layer(s) comprising silicon oxide, tetraethyl orthosilicate (TEOS), phosphosilicate glass (PSG), borophosphosilicate glass (BPSG), fluorinated silicate glass (FSG), $SiO_xC_y$, spin-on-glass (SOG), spin-on-polymers, silicon carbon material, compounds thereof, composites thereof, combinations thereof, or the like, formed by any suitable method, such as CVD, PECVD, spinning, the like, or a combination thereof, may be disposed over the contact material 170/172, not shown. ILD material 168 shown in FIG. 19C may also comprise similar materials and formation methods, for example. Conductive lines and vias comprising copper or other metals disposed in a plurality of insulating material layers may be disposed over the ILD. Vias or plugs may be formed within the additional ILD layer(s) that make electrical contact with the contact material 170/172 of the semiconductor device 100, also not shown.

The final structure of the semiconductor device 100 shown in FIGS. 19A, 19B, and 19C comprises a FinFET device in some embodiments. The fins 52 and epitaxial fins 129 comprise the source and drain regions of the FinFET device. The gate electrode 162 and gate dielectric 160 function as a gate and gate dielectric of the FinFET device. A channel region of the FinFET device is disposed beneath the gate dielectric 160 and the gate electrode 162, within the epitaxial fin 66. The first layer 170 and the second layer 172 comprise wrap-around contacts for the source and drain regions 129.

For example, in some embodiments, the semiconductor device 100 comprises a FinFET device that includes the substrate 50, and a first fin 52 (e.g., the left fin 52 in FIG. 19B) and a second fin 52 (e.g., the right fin 52) disposed over the substrate 50. The second fin 52 is disposed proximate the first fin 52 and runs parallel to the first fin 52 lengthwise, e.g., in and out of the paper in the view shown in FIG. 19B by a predetermined distance. An isolation region 58 is disposed between the first (left) fin 52 and the second (right) fin 52. A first epitaxial fin 129 (e.g., the left epitaxial fin 129) with an upper portion comprising a substantially pillar shape is disposed over the first fin 52. The first fin 52 and the first epitaxial fin 129 on the left side of FIG. 19B comprise a source region 52/129 of the FinFET device. A second epitaxial fin 129 (e.g., the right epitaxial fin 129) with an upper portion comprising a substantially pillar shape is disposed over the second fin 52. The second fin 52 and the second epitaxial fin 129 on the right side of FIG. 19B comprise a drain region 52/129 of the FinFET device. At least one of the gate electrodes 162 shown in FIG. 19A is disposed between the source region 52/129 and the drain region 52/129 and functions as a gate of the FinFET device. A channel region of the FinFET device is disposed beneath the gate electrode 162 within the epitaxial fin 66. A first wrap-around contact comprising the contact material 170/172 is disposed over the source region 52/129, and a second wrap-around contact comprising contact material 170/172 is disposed over the drain region 52/129.

Figure 20A:
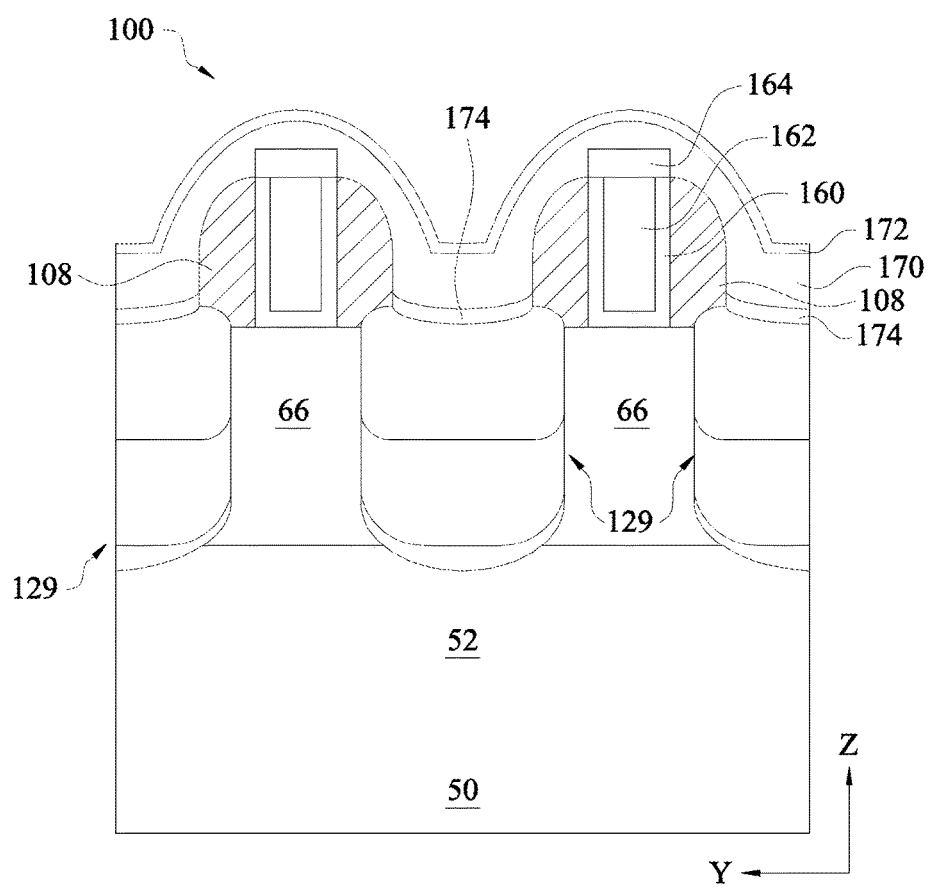
FIGS. 20A and 20B are cross-sectional views that illustrate a semiconductor device in accordance with some embodiments.
Figure 20B:
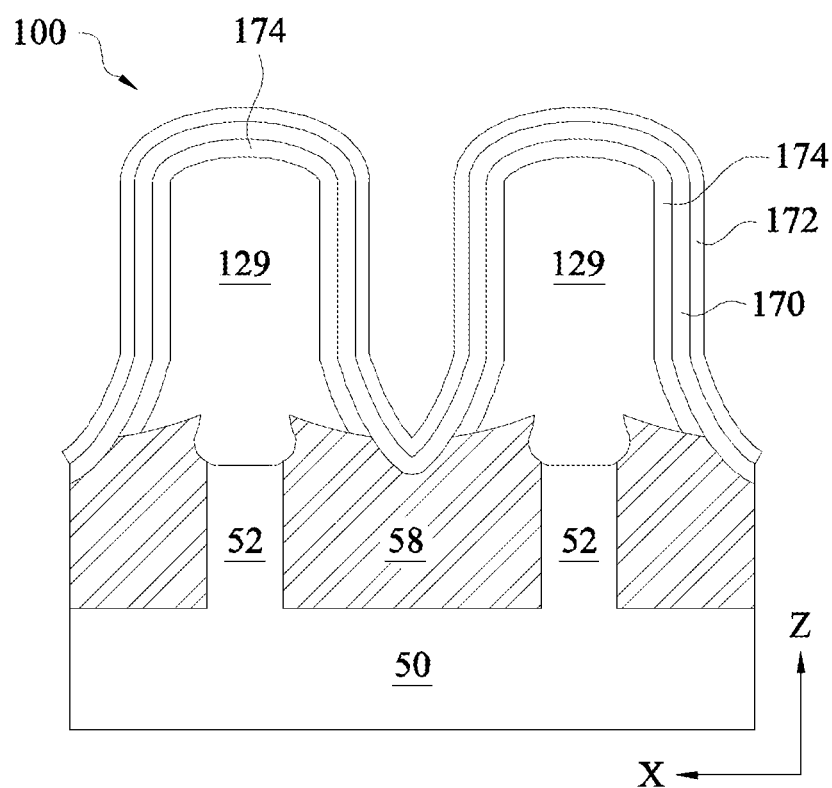

FIGS. 20A and 20B are cross-sectional views that illustrate a semiconductor device 100 in accordance with some embodiments of the present disclosure. After the manufacturing steps for the embodiments shown in FIGS. 19A, 19B, and 19C, the semiconductor device 100 is annealed to form a silicide or germanide material 174. The silicide or germanide material 174 is disposed over the source and drain regions 52/129 (FIG. 20B) and over the epitaxial fins 129 between channel regions beneath the gate electrodes 162 (FIG. 20A). The silicide or germanide material 174 is disposed between the source region 52/129 and the first wrap-around contact comprising the contact material 170/172, and the silicide or germanide material 174 is also disposed between the drain region 52/129 and the second wrap-around contact comprising contact material 170/172.

In embodiments wherein the first layer 170 comprises Ti and the epitaxial fins 129 comprise Si, the silicide or germanide material 174 may comprise TiSi, as an example. The silicide or germanide material 174 may comprise TiSi, TiGe, TiSiGe, Yb, Si, ErSi, YSi, NiSi, CoSi, YbGe, ErGe, YGe, NiGe, combinations thereof, or a III-V metal alloy, as examples. The silicide or germanide material 174 comprises a conductive material, and the thus, the wrap-around contacts 170/172/174 for the source and drain regions 52/129 are considered to include the silicide or germanide material 174 in some embodiments. The silicide or germanide material 174 improves conductivity of the wrap-around contacts 170/172/174 and lowers contact resistance of the wrap-around contacts 170/172/174, in some embodiments. The silicide or germanide material 174 may be formed by annealing the semiconductor device 100 for a centi-second or a few centi-seconds at a temperature of about 800 degrees C. to about 1,000 degrees C. or using a nano-second level laser anneal, as examples. The silicide or germanide material 174 may consume a portion of the material of the epitaxial fins 129 and/or the first layer 170, for example. The silicide or germanide material 174 comprises a thickness of about 2 nm to about 10 nm, for example. The silicide or germanide material 174 may also comprise other materials, dimensions, and formation methods.

FIG. 20B also illustrates some embodiments wherein the barrier portions 110 of the spacer layer 106 are completely removed in the manufacturing process step shown in FIG. 16B. The epitaxial fins 129 are disposed directly over and abutting the fins 52 and also the isolation regions 58 in these embodiments, for example.

Figure 20D:
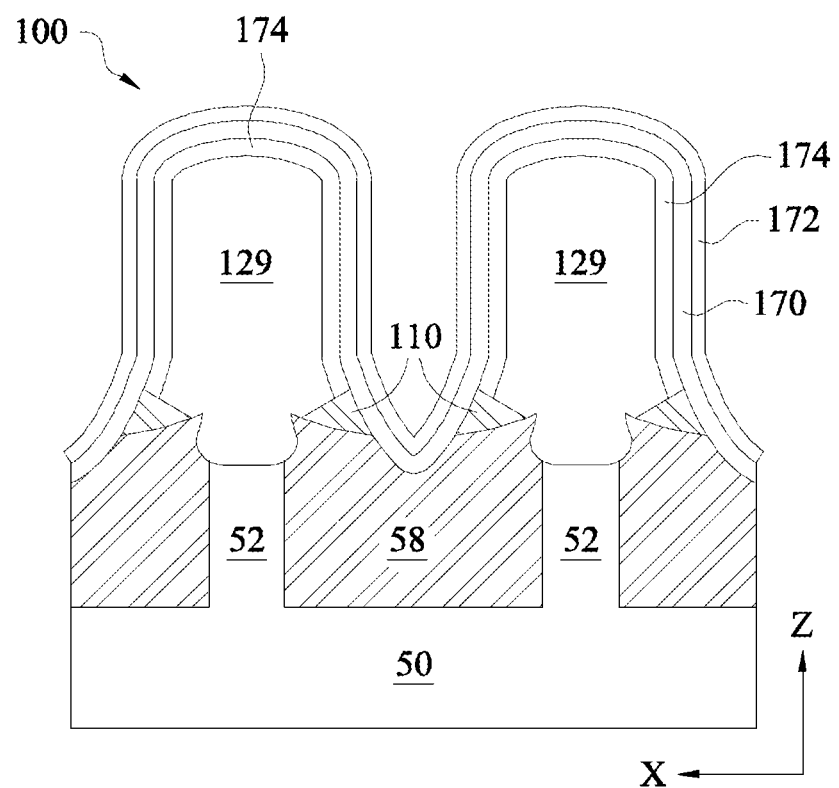
FIG. 20D is a cross-sectional view that illustrates a semiconductor device in accordance with some embodiments.

FIG. 20D is a cross-sectional view that illustrates a semiconductor device 100 in accordance with other embodiments after an anneal process to form the silicide or germanide material 174. Similar embodiments as shown in FIG. 20B are illustrated, wherein portions of the barrier portions 110 are left remaining over the isolation regions 58 after the barrier portions 110 are removed in the manufacturing process step shown in FIG. 16B. The portions of the barrier portions 110 comprise the same material as the gate spacers 108 (see FIG. 20A) and are disposed between the isolation regions 58 and edge portions of the epitaxial fins 129. A portion of a material of the gate spacers 108 is disposed between an edge of the source region 52/129 and the isolation region 58 and between an edge of the drain region 52/129 and the isolation region 58 in these embodiments, for example.

Figure 21A:
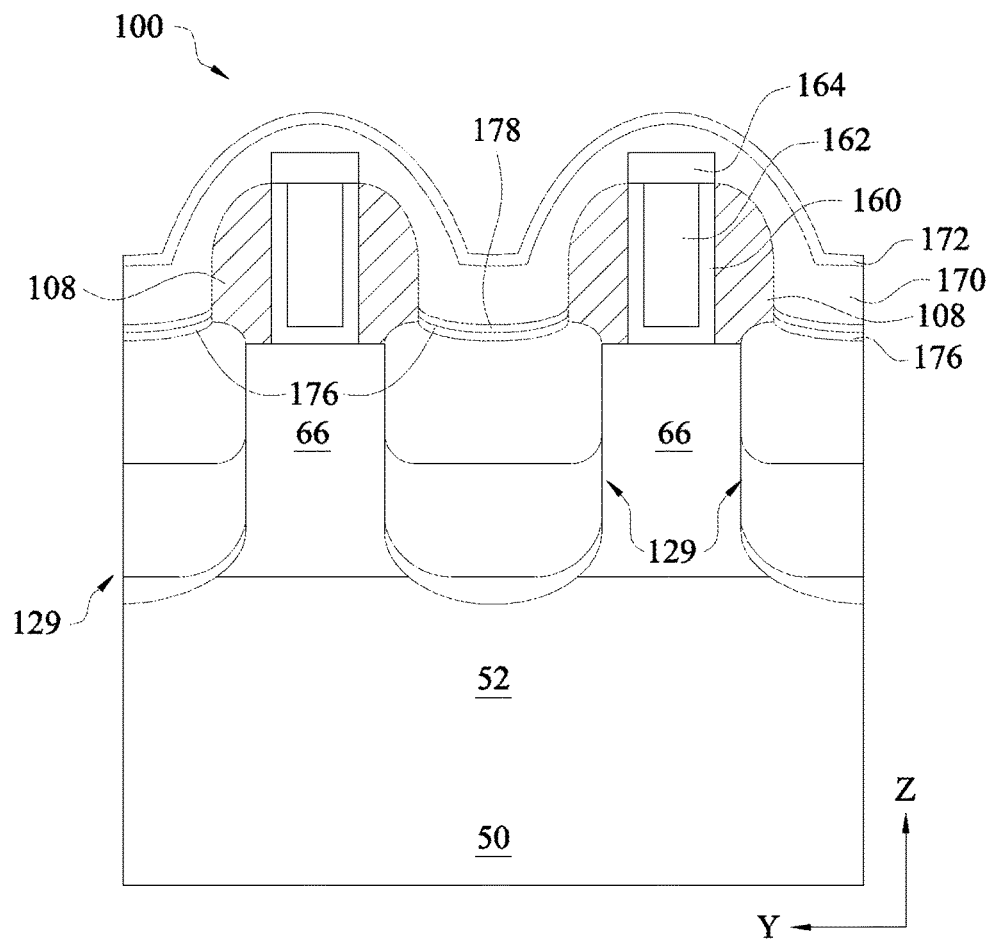
FIGS. 21A, 21B, 22A, and 22B are cross-sectional views that illustrate a semiconductor device at various stages of manufacturing in accordance with some embodiments.
Figure 21B:
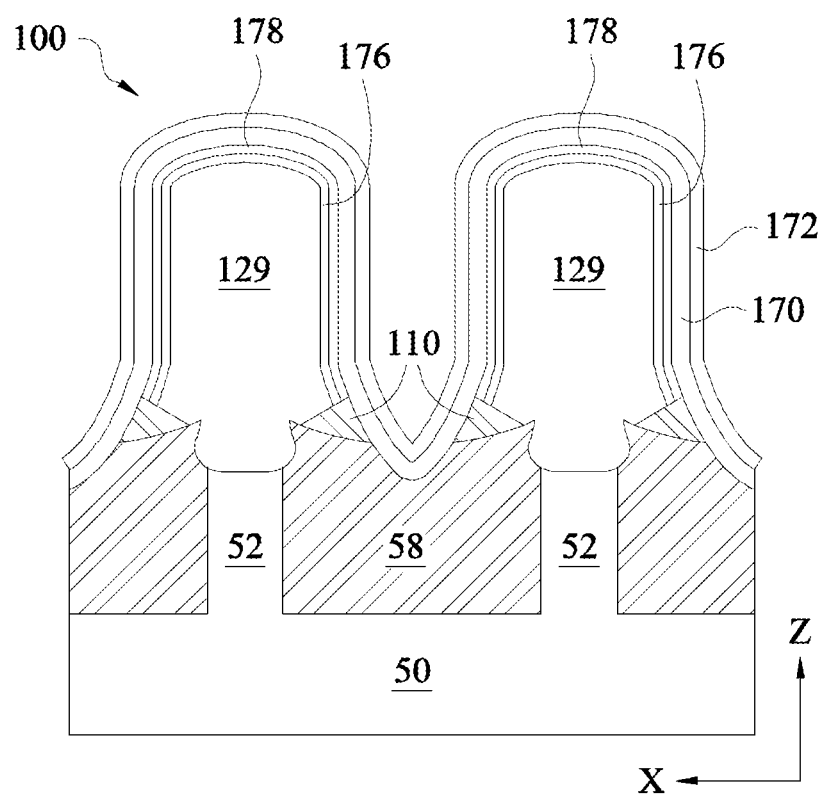

FIGS. 21A, 21B, 22A and 22B are cross-sectional views that illustrate a semiconductor device 100 at various stages of manufacturing in accordance with some embodiments. Before the contact material 170/172 is formed over the semiconductor device 100 as shown in FIGS. 19A and 19B, a cap layer 176 is formed over the source and drain regions 52/129, e.g., over the epitaxial fins 129, as shown in FIGS. 21A and 21B. The cap layer 176 comprises polycrystalline silicon, single crystalline silicon, or InAs having a thickness of about 8 nm to about 10 nm that is formed by an epitaxial growth process or other methods, as examples. The cap layer 176 may also comprise other materials, dimensions, and growth methods. The cap layer 176 may be formed on the epitaxial fins 129 using a selective epitaxial growth process or a deposition process followed by a CMP process, as examples. Alternatively, the cap layer 176 may be formed using other methods.

An amorphous layer 178 is then formed over the cap layer 176, also shown in FIGS. 21A and 21B. The amorphous layer 178 is formed in some embodiments using a pre-amorphorization implant (PAI), in which Ge, As, P, B, Yb, Y, Er, or other species is implanted to amorphize the top surface of the epitaxial fins 129 that are capped with the cap layer 176, for example. The amorphous layer 178 comprises amorphous silicon or amorphous InAs in some embodiments, as examples. The amorphous layer 178 may also comprise other materials and may be formed using other methods. The contact layers 170 and 172 are then formed over the amorphous layer 178, the isolation regions 58, the gate spacers 108, and the SACs 164, which is also shown in FIGS. 21A and 21B.

Figure 22A:
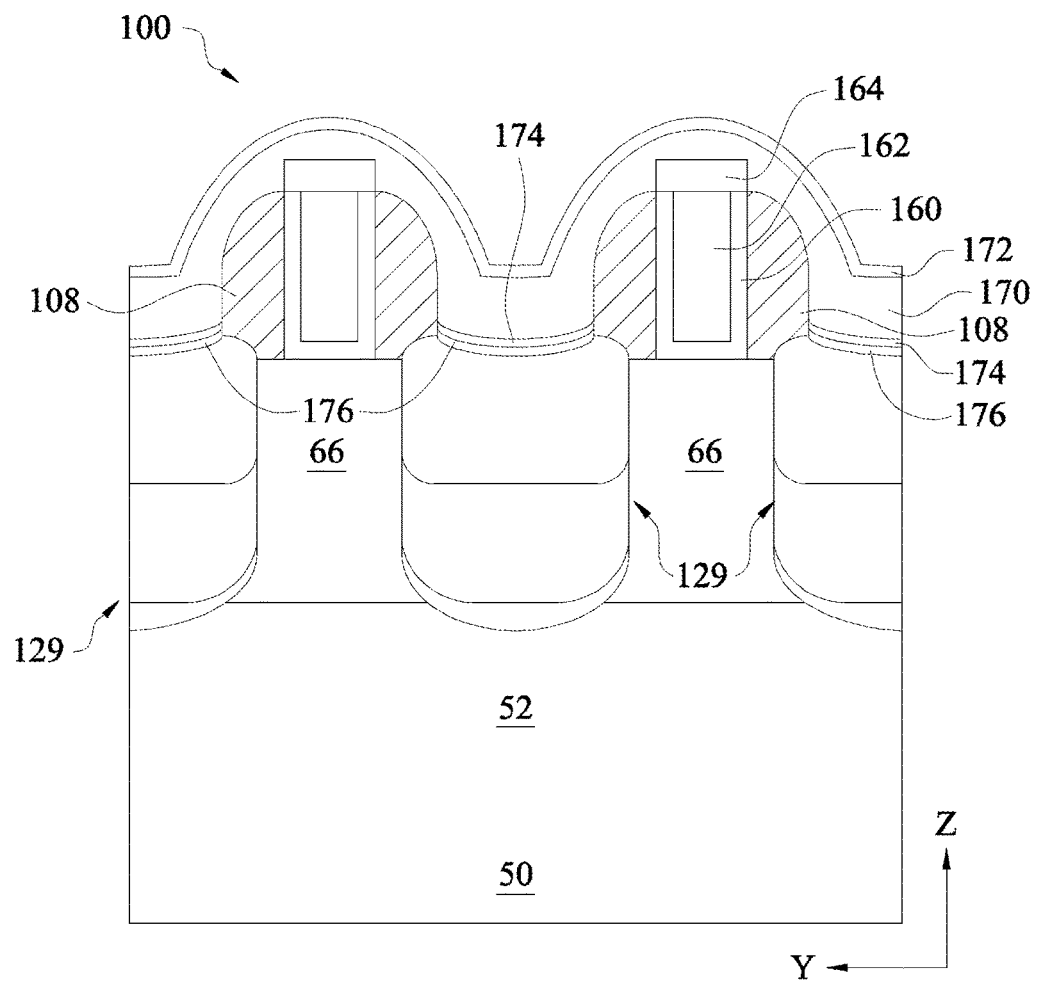
Figure 22B:
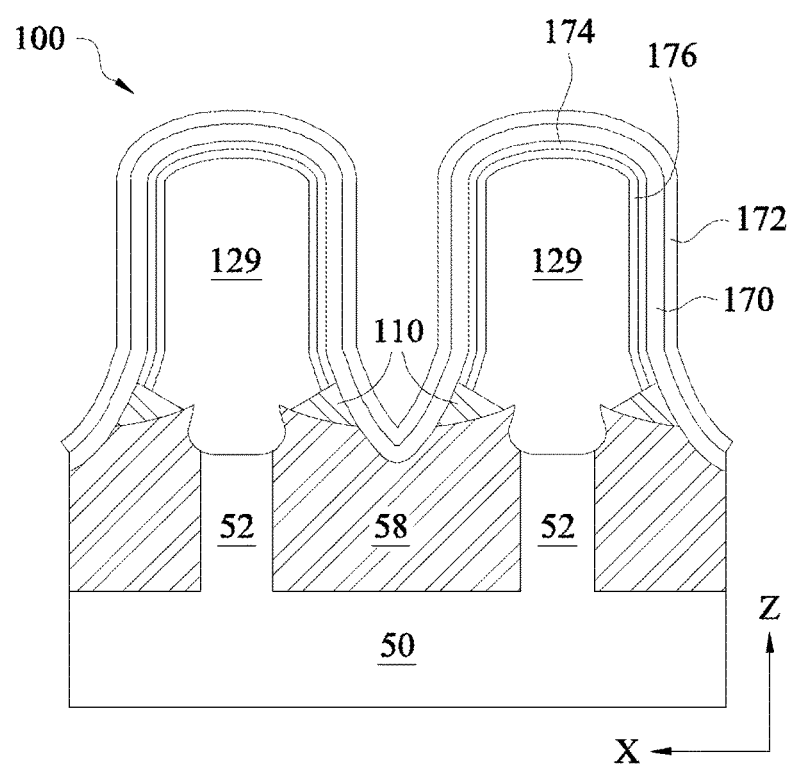

Thus, a cap layer 176 is disposed over the source and drain regions 52/129 comprising the epitaxial fins 129, and an amorphous layer 178 is disposed over the cap layer 176 beneath the first wrap-around contact comprising the contact material 170/172 and the second wrap-around contact comprising the contact material 170/172 for the source and drain regions 52/129, respectively, in some embodiments, before the deposition of the contact material 170/172 and before annealing the semiconductor device 100 to form a silicide and germanide material 174 (see FIGS. 22A and 22B).

Referring next to FIGS. 22A and 22B, the semiconductor device 100 is then annealed to form a silicide and germanide material 174 between the cap layer 176 and the contact materials 170/172. The anneal process comprises similar parameters as described for the anneal process shown and described for FIGS. 20A and 20B, for example. The amorphous material 178 disposed over the epitaxial fins 129 reacts with the overlying contact material 170 to form a silicide and germanide material 174.

Thus, in accordance with some embodiments, a cap layer 176 is formed over the source regions 52/129 and the drain regions 52/129, and a surface of the cap layer 176 is amorphized, before forming the contact material 170/172 over the gate materials 162, the source regions 52/129, and the drain regions 52/129. After forming the contact material 170/172, the semiconductor device 100 is then annealed to form a silicide or germanide material 174 between the cap layer 170 and the contact material 170/172.

In FIG. 22B, a portion of the barrier portions 110 is illustrated being disposed between edge portions of the epitaxial fins 129 and the isolation regions 58. In other embodiments, the barrier portions 110 are completely removed, and the edge portions of the epitaxial fins 129 are disposed directly over and abutting the isolation regions 58, as shown in FIG. 20B.

FIG. 23B is a cross-sectional view that illustrates a semiconductor device 100 in accordance with some embodiments. A material of the gate spacers (see gate spacers 108 shown in FIG. 22A, for example) is disposed between the source region 52/129 on the left and the drain region 52/129 on the right. During a previous processing step for the semiconductor device 100, a residue comprising the material of the gate spacers 108 is left remaining, because of the close proximity of the pillar-shaped epitaxial fins 129. For example, during the processing step shown in FIG. 16B to remove at least a portion of the barrier portions 110 of the spacer layer 106, a portion of the material of the gate spacers 108, which comprises the same material as the spacer layer 106 and the barrier portions 110 of the spacer layer 106, may form between the epitaxial fins 129 over the isolation regions 58. The residue 106 comprising the material of the gate spacers 108 may also be formed and left remaining between the epitaxial fins 129 during other processing steps. In some embodiments, the etch process for the material of the gate spacers 108 is intentionally controlled so that the residue 106 is formed between the source and drain regions 52/129, as another example.

FIG. 23B also illustrates some embodiments wherein an oxide material 114 is left remaining between the epitaxial fins 129 over the isolation regions 58 during a previous processing step. The oxide material 114 may comprise a material of the sacrificial material 114 in some embodiments, for example. The oxide material 114 is disposed between the isolation regions 58 and the material 106 of the gate spacers 108 in some embodiments, for example. During the anisotropic etch process for the sacrificial material 114 shown in FIG. 14B, a portion of the sacrificial material 114 is left remaining between the epitaxial fins 129, for example. The etch process for the sacrificial material 114 may comprise a dry anisotropic RIE, and a re-entrance shape of the structure of the semiconductor device 100 causes the sacrificial material 114 to be less easily removed in the bottom of the trenches, for example. The etch process for the sacrificial material 114 may also be controlled so that a portion of the sacrificial material 114 is left remaining between the source and drain regions 52/129, as another example.

After the manufacturing process steps shown in FIGS. 19A, 19B, 20A, 20B, 22A, 22B, and 23B, additional manufacturing process steps may also be formed, for example, such as some of the manufacturing process steps described in the related application.

Some embodiments of the present disclosure comprise methods of manufacturing semiconductor devices 100 and FinFET devices. Some embodiments also include semiconductor devices 100 and FinFET devices manufactured using the methods described herein.

Some embodiments of the present disclosure achieve advantages by providing pillar-shaped source and drain regions for FinFET devices. The pillar shapes, rather than rhombus or diamond shapes (e.g., in a cross-sectional view) of the epitaxial fins of the source and drain regions provide several advantages, such as providing the ability to place the epitaxial fins closer together, thus allowing for further scaling of devices. The pillar-shaped epitaxial fins also provide fully wrapped-around contacts for the source and drain regions with maximized contact area, and improve the contact resistance (Rcsd) performance (i.e., reduce the Rcsd). The contact material wraps completely around exposed portions of the epitaxial fins having the pillar shape, for example. Additional contact area for contacts is achieved by the pillar-shaped epitaxial fins. A sacrificial material is used to form and control the pillar shape formation during epitaxial growth of the fins, preventing a rhombus or diamond shape from forming due to faceted epitaxial growth. Future scaling of the contact area independent of the epitaxial fin spacing is provided by some embodiments of the present disclosure, by the inclusion of the pillar-shaped epitaxial fins in the source and drain regions. Furthermore, the manufacturing process steps described herein are easily implementable into existing manufacturing process flows.

In some embodiments, a semiconductor device includes a substrate comprising a first fin and a second fin, and a first epitaxial fin disposed over the first fin. A second epitaxial fin is disposed over the second fin. The second fin is proximate the first fin. The first epitaxial fin and the second epitaxial fin comprise an upper portion comprising a substantially pillar shape.

In other embodiments, a FinFET device includes a substrate, a first fin and a second fin disposed over the substrate, and an isolation region disposed between the first fin and the second fin. A first epitaxial fin with an upper portion comprising a substantially pillar shape is disposed over the first fin, the first fin and the first epitaxial fin comprising a source region. A second epitaxial fin with an upper portion comprising a substantially pillar shape disposed over the second fin, the second fin and the second epitaxial fin comprising a drain region. A gate electrode is disposed between the source region and the drain region, and a channel region is disposed beneath the gate electrode. A first wrap-around contact is disposed over the source region, and a second wrap-around contact is disposed over the drain region.

In other embodiments, a method of manufacturing a semiconductor device includes forming a plurality of fins in a substrate, forming isolation regions between the plurality of fins, recessing the plurality of fins, and epitaxially growing a material over each of the plurality of fins to form a plurality of first epitaxial fins. The method includes recessing a top portion of the isolation regions to expose the plurality of first epitaxial fins, forming a first sacrificial material over the plurality of first epitaxial fins and the isolation regions, and patterning the first sacrificial material to leave portions of the first sacrificial material disposed over first portions of the first epitaxial fins. The method also includes forming a spacer layer over the first sacrificial material, second portions of the plurality of first epitaxial fins, and the isolation regions. The spacer layer is etched to leave gate spacers disposed on sidewalls of the portions of the first sacrificial material and to leave barrier portions of the spacer layer disposed on sidewalls of the plurality of first epitaxial fins. A second sacrificial material is formed over top surfaces of the portions of the first sacrificial material, top surfaces of the plurality of first epitaxial fins, top surfaces of the isolation regions, and top surfaces and sidewalls of the gate spacers and the barrier portions of the spacer layer. The second sacrificial material is etched to leave portions of the second sacrificial material on sidewalls of the gate spacers and the barrier portions of the spacer layer on sidewalls of the plurality of first epitaxial fins. The method includes etching the plurality of first epitaxial fins to form recesses, removing a portion of the barrier portions of the spacer layer, and epitaxially growing a semiconductive material in the recesses to form a second epitaxial fin over each of the plurality of fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a plurality of fins in a substrate;
    forming isolation regions between the plurality of fins;
    recessing the plurality of fins;
    epitaxially growing a material over each of the plurality of fins to form a plurality of first epitaxial fins;
    recessing a top portion of the isolation regions to expose the plurality of first epitaxial fins;
    forming a first sacrificial material over the plurality of first epitaxial fins and the isolation regions;
    patterning the first sacrificial material to leave portions of the first sacrificial material disposed over first portions of the plurality of first epitaxial fins;
    forming a spacer layer over the first sacrificial material, second portions of the plurality of first epitaxial fins, and the isolation regions;
    etching the spacer layer to leave gate spacers disposed on sidewalls of the portions of the first sacrificial material and to leave barrier portions of the spacer layer disposed on sidewalls of the plurality of first epitaxial fins;
    forming a second sacrificial material over top surfaces of the portions of the first sacrificial material, top surfaces of the plurality of first epitaxial fins, top surfaces of the isolation regions, and top surfaces and sidewalls of the gate spacers and the barrier portions of the spacer layer;
    etching the second sacrificial material to leave portions of the second sacrificial material on sidewalls of the gate spacers and the barrier portions of the spacer layer on sidewalls of the plurality of first epitaxial fins;
    selectively etching the plurality of first epitaxial fins to form recesses while retaining the second sacrificial material and the barrier portions of the spacer layer in a cross-section view of a source/drain region;
    after selectively etching the plurality of first epitaxial fins, forming barrier portion residues by selectively removing upper portions of the barrier portions of the spacer layer while retaining the second sacrificial material, the barrier portion residues disposed on opposing sides of the source/drain region;
    epitaxially growing a semiconductive material in the recesses to form a plurality of second epitaxial fins, the plurality of second epitaxial fins disposed over the plurality of fins; and
    after growing the semiconductive material, removing the second sacrificial material.

2. The method according to claim 1, wherein forming the first sacrificial material comprises forming a dummy dielectric layer, forming a dummy gate layer over the dummy dielectric layer, and forming a mask layer over the dummy gate layer.

3. The method according to claim 1, wherein forming the spacer layer comprises forming a material selected from the group consisting essentially of silicon nitride (SiN), silicon carbon-nitride (SiCN), silicon carbon-oxynitride (SiCON), and combinations thereof.

4. The method according to claim 3, wherein forming the spacer layer comprises forming a bi-layer of two different materials.

5. The method according to claim 1, wherein etching the spacer layer or etching the second sacrificial material comprises an anisotropic etch process.

6. The method according to claim 1, wherein forming the second sacrificial material comprises forming a conformal material selected from the group consisting of silicon dioxide ($SiO_2$), an oxide doped with phosphorous, an oxide doped with boron, and combinations thereof.

7. The method according to claim 1, wherein epitaxially growing the material comprises forming portions of source regions and drain regions of a fin field effect transistor (FinFET) device, wherein a first one of the plurality of fins and a first one of the plurality of second epitaxial fins comprises the source region, wherein a second one of the plurality of fins and a second one of the plurality of second epitaxial fins comprises the drain region, and wherein the method further comprises:
    removing the first sacrificial material;
    forming a gate dielectric and a gate material in regions where the first sacrificial material was removed from; and
    forming a contact material over the gate material, the source region, and the drain region.

8. The method according to claim 7, further comprising forming a cap layer over the source region and the drain region and amorphizing a surface of the cap layer, before forming the contact material; and annealing the semiconductor device to form a silicide or germanide material between the cap layer and the contact material, after forming the contact material.

9. The method of claim 1, wherein each of the barrier portion residues have a tapered shape that tapers in a direction toward a laterally adjacent region disposed over a respective fin of the plurality of fins.

10. A method of manufacturing a semiconductor device, the method comprising:
   forming a first fin and a second fin over a substrate;
   forming an isolation region between the first fin and the second fin;
   recessing the first fin and the second fin;
   growing a first epitaxial fin over the first fin, the first epitaxial fin comprising a first upper portion;
   growing a second epitaxial fin over the second fin, the second epitaxial fin comprising a second upper portion;
   recessing a top portion of the isolation region to expose the first epitaxial fin and the second epitaxial fin;
   forming a first sacrificial material over the first epitaxial fin, the second epitaxial fin, and the isolation region;
   patterning the first sacrificial material to leave portions of the first sacrificial material disposed over first portions of the first epitaxial fin and the second epitaxial fin;
   forming a spacer layer over the first sacrificial material, second portions of the first epitaxial fin and the second epitaxial fin, and the isolation region;
   etching the spacer layer to form a gate spacer disposed on sidewalls of the portions of the first sacrificial material, and to leave barrier portions of the spacer layer on sidewalls of the first epitaxial fin and the second epitaxial fin;
   forming a second sacrificial material over top surfaces of the portions of the first sacrificial material, top surfaces of the first epitaxial fin and the second epitaxial fin, top surfaces of the isolation region, and top surfaces and sidewalls of the gate spacer and the barrier portions of the spacer layer;
   etching the second sacrificial material to leave portions of the second sacrificial material on sidewalls of the gate spacer and the barrier portions of the spacer layer on sidewalls of the first epitaxial fin and the second epitaxial fin in cross-sectional views of respective source/drain regions;
   selectively removing the first upper portion of the first epitaxial fin and the second upper portion of the second epitaxial fin to form a first recess and a second recess, respectively, while retaining the second sacrificial material and the barrier portions of the spacer layer;
   after selectively removing the first upper portion and the second upper portion, forming barrier portion residues by selectively removing upper portions of the barrier portions of the spacer layer while retaining the second sacrificial material, wherein the barrier portion residues are disposed on opposing sides of the respective source/drain regions;
   epitaxially growing a semiconductive material in the first recess and the second recess to form a third epitaxial fin and a fourth epitaxial fin, respectively, wherein the third epitaxial fin is disposed over the first fin, and the fourth epitaxial fin is disposed over the second fin; and
   after epitaxially growing the semiconductive material, removing the second sacrificial material.

11. The method of claim 10, wherein the first epitaxial fin and the second epitaxial fin comprise a first width proximate a middle portion and a second width proximate the upper portion, the first width being greater than the second width.

12. The method of claim 11, wherein the first epitaxial fin and the second epitaxial fin comprise a third width proximate a lower portion, the third width being less than the first width.

13. The method of claim 10, wherein the first fin and the first epitaxial fin comprise a source region of a fin field effect transistor (FinFET) device.

14. The method of claim 10, wherein forming the first sacrificial material comprises forming a dummy dielectric layer, forming a dummy gate layer over the dummy dielectric layer, and forming a mask layer over the dummy gate layer.

15. The method of claim 13, wherein the second fin and the second epitaxial fin comprise a drain region of the FinFET device.

16. The method of claim 15, further comprising disposing a gate electrode between the source region and the drain region.

17. A method of manufacturing a semiconductor device, the method comprising:
   forming a first fin and a second fin over a substrate, the first fin having a first width, the second fin having a second width;
   forming an isolation region between the first fin and the second fin;
   recessing the first fin and the second fin, thereby forming a first opening over a remaining portion of the first fin and a second opening over a remaining portion of the second fin, the first opening having a third width, the second opening having a fourth width, the first width being less than the third width, the second width being less than the fourth width;
   depositing a first epitaxial fin over the first fin in the first opening, the first fin and the first epitaxial fin comprising a source region;
   depositing a second epitaxial fin over the second fin in the second opening, the second fin and the second epitaxial fin comprising a drain region;
   forming a first sacrificial material over the first epitaxial fin, the second epitaxial fin, and the isolation region;
   patterning the first sacrificial material to leave remaining portions of the first sacrificial material disposed over first portions of the first epitaxial fin and the second epitaxial fin;
   forming a spacer layer over the first sacrificial material, second portions of the first epitaxial fin and the second epitaxial fin, and the isolation region;
   forming gate spacers from the spacer layer, wherein the gate spacers are disposed on sidewalls of the first sacrificial material;
   forming a gate dielectric and a gate electrode between the gate spacers;
   forming a channel region beneath the gate electrode;
   disposing a first wrap-around contact over the source region;
   disposing a second wrap-around contact over the drain region;
   forming, from material of the gate spacers:
      a first barrier portion disposed under first edges of the first epitaxial fin beneath widest portions of the first epitaxial fin, the first barrier portion interposing and contacting widest portions of the first epitaxial fin and the isolation region; and
      a second barrier portion disposed under second edges of the second epitaxial fin beneath widest portions of the second epitaxial fin, the second barrier portion interposing and contacting widest portions of the second epitaxial fin and the isolation region;
   forming a second sacrificial material over upper surfaces of the first sacrificial material, upper surfaces of the first epitaxial fin and the second epitaxial fin, upper surfaces of the isolation region, and upper surfaces and sidewalls of the gate spacers, the first barrier portion, and the second barrier portion;

removing a portion of the second sacrificial material to leave portions of the second sacrificial material on sidewalls of the gate spacers;

selectively removing the first epitaxial fin and the second epitaxial fin to form a first recess and a second recess, respectively, while retaining the second sacrificial material, the first barrier portion, and the second barrier portion;

after selectively removing the first epitaxial fin and the second epitaxial fin, forming barrier portion residues by selectively removing material of the first barrier portion and the second barrier portion while retaining the second sacrificial material;

epitaxially growing a semiconductor material in the first recess and the second recess; and after growing the semiconductor material, selectively removing the second sacrificial material.

18. The method of claim 17, wherein the first barrier portion has first tapered profiles tapering toward the source region, and the second barrier portion has second tapered profiles tapering toward the drain region.

19. The method of claim 17, further comprising disposing a silicide material or a germanide material between the source region and the first wrap-around contact, and between the drain region and the second wrap-around contact.

20. The method of claim 19, further comprising forming a cap layer over the source region and the drain region beneath the silicide material or germanide material.

\* \* \* \* \*